US010411070B2

(12) United States Patent
Lee

(10) Patent No.: US 10,411,070 B2
(45) Date of Patent: Sep. 10, 2019

(54) SEMICONDUCTOR MEMORY DEVICE INCLUDING A SELECTION ELEMENT PATTERN CONFINED TO A HOLE

(71) Applicant: SK hynix Inc., Icheon (KR)

(72) Inventor: Jong Chul Lee, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 16/019,346

(22) Filed: Jun. 26, 2018

(65) Prior Publication Data
US 2019/0157346 A1    May 23, 2019

(30) Foreign Application Priority Data
Nov. 22, 2017  (KR) .................. 10-2017-0156377

(51) Int. Cl.
*G06F 12/00* (2006.01)
*H01L 27/24* (2006.01)
*H01L 45/00* (2006.01)
*G06F 3/06* (2006.01)

(52) U.S. Cl.
CPC ........ *H01L 27/2409* (2013.01); *G06F 3/0604* (2013.01); *G06F 3/0659* (2013.01); *G06F 3/0673* (2013.01); *H01L 45/1233* (2013.01); *H01L 45/1253* (2013.01); *H01L 45/16* (2013.01); *H01L 45/06* (2013.01); *H01L 45/08* (2013.01); *H01L 45/144* (2013.01); *H01L 45/146* (2013.01)

(58) Field of Classification Search
CPC ............. H01L 27/2409; H01L 45/1233; G06F 3/0604; G06F 3/0659
See application file for complete search history.

(56) References Cited

U.S. PATENT DOCUMENTS 8,394,669 B2    3/2013  Arita et al.
9,373,665 B2    6/2016  Terai

*Primary Examiner* — Arvind Talukdar

(57) ABSTRACT

An electronic device having a semiconductor memory device is provided. The semiconductor memory device may include a lower interlayer insulating layer having a hole; an upper interlayer insulating layer disposed on the lower interlayer insulating layer; and a memory cell stack including a lower element and an upper element, the lower element being confined to the hole of the lower interlayer insulating layer, the upper element being surrounded by the upper interlayer insulating layer. The lower element may include a lower electrode and a selection element pattern disposed on the lower electrode. The upper element may include a memory pattern disposed on the selection element pattern and an upper electrode disposed on the memory pattern.

20 Claims, 31 Drawing Sheets

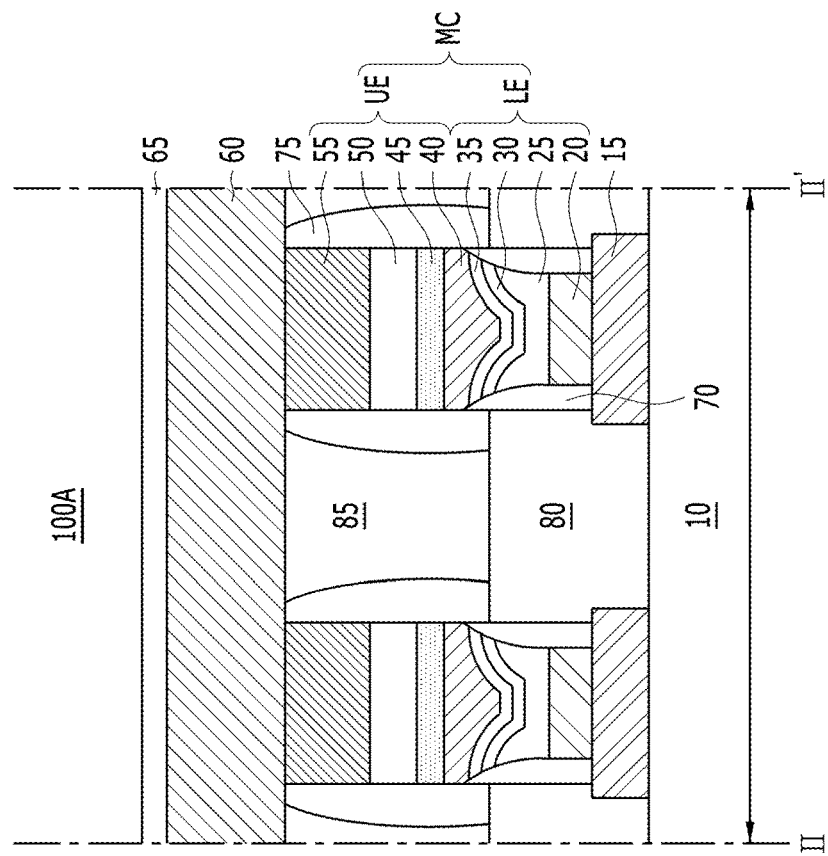
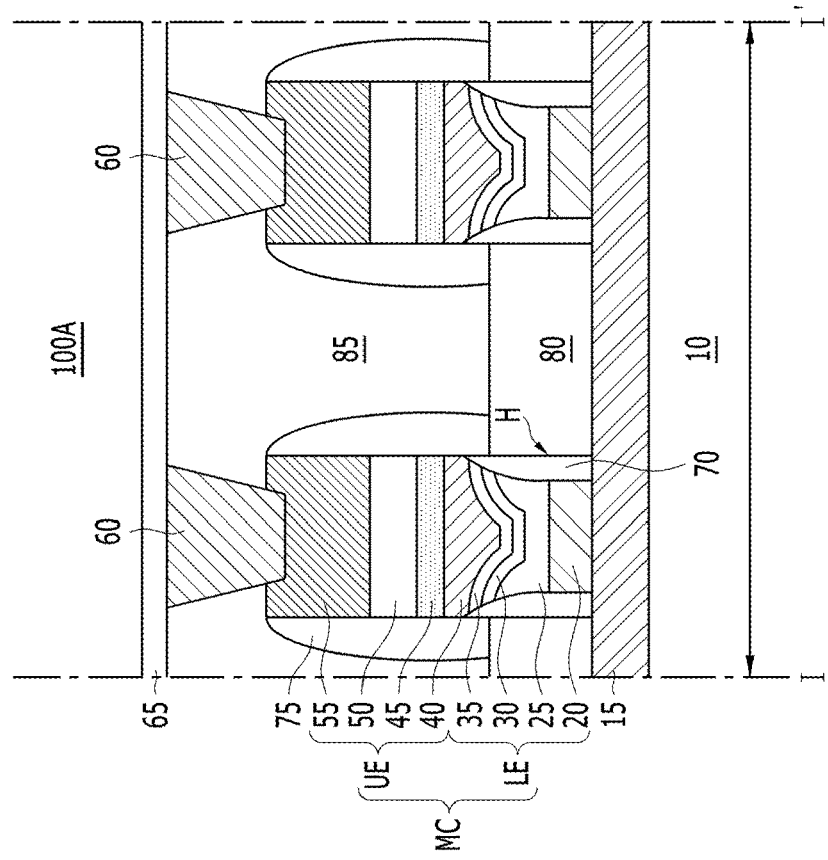

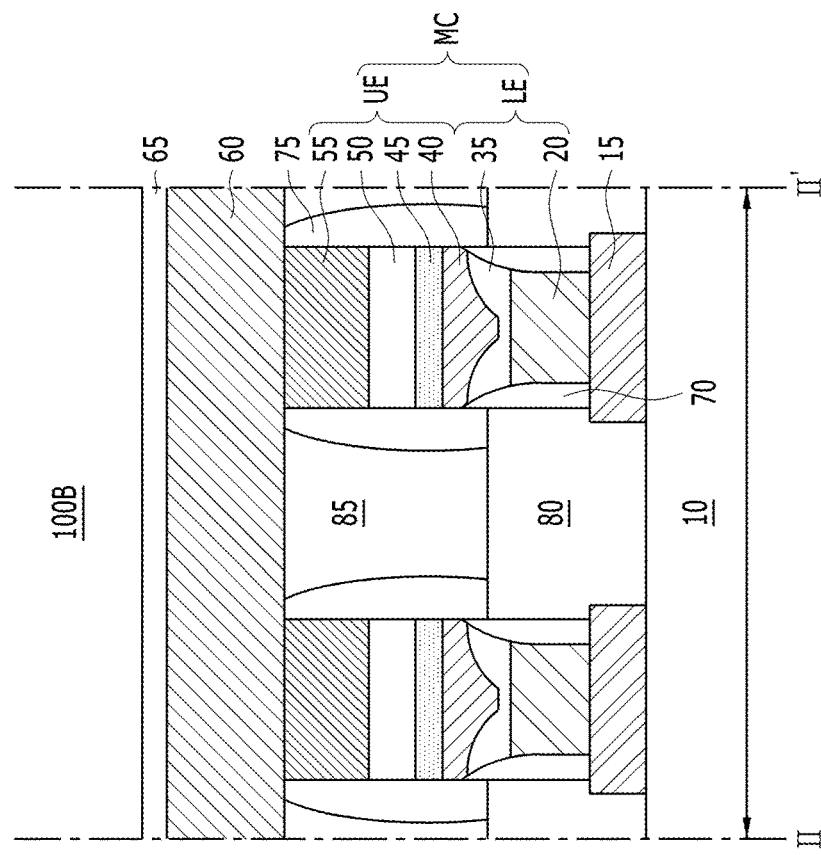
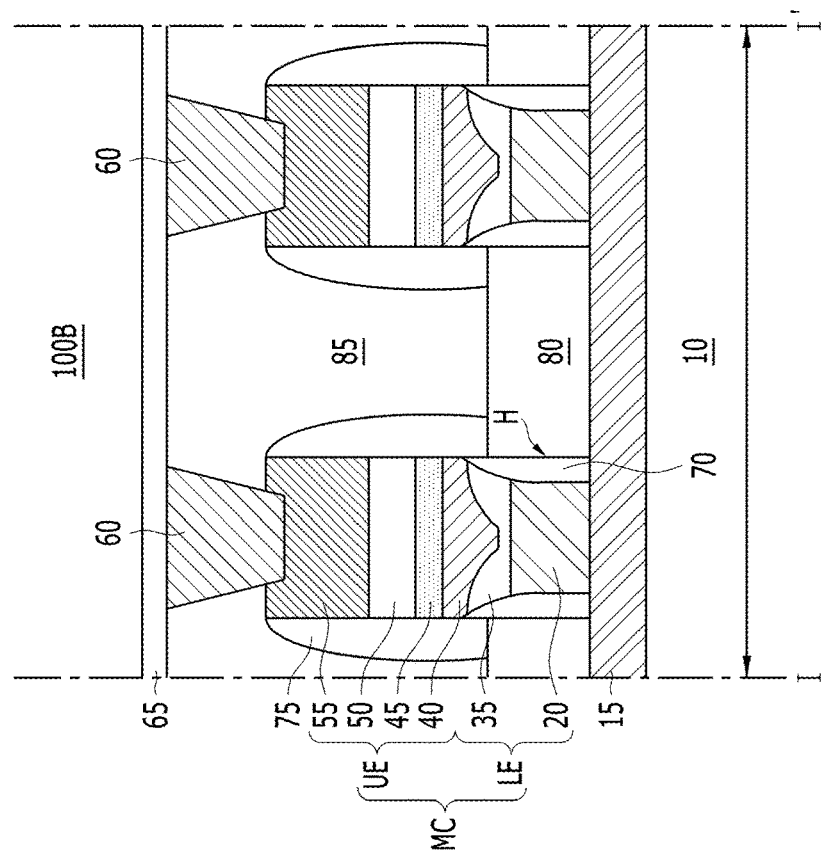

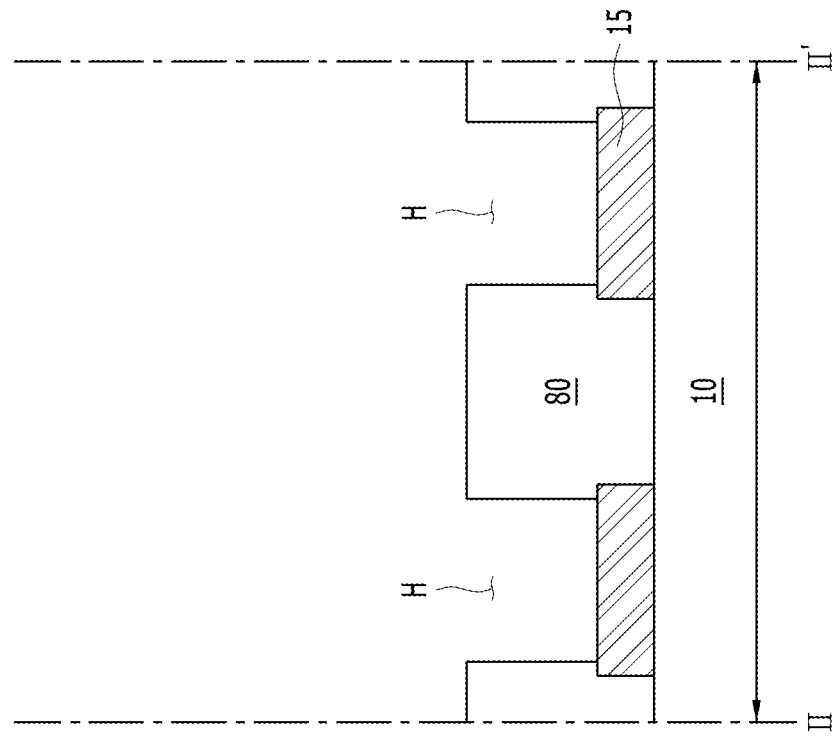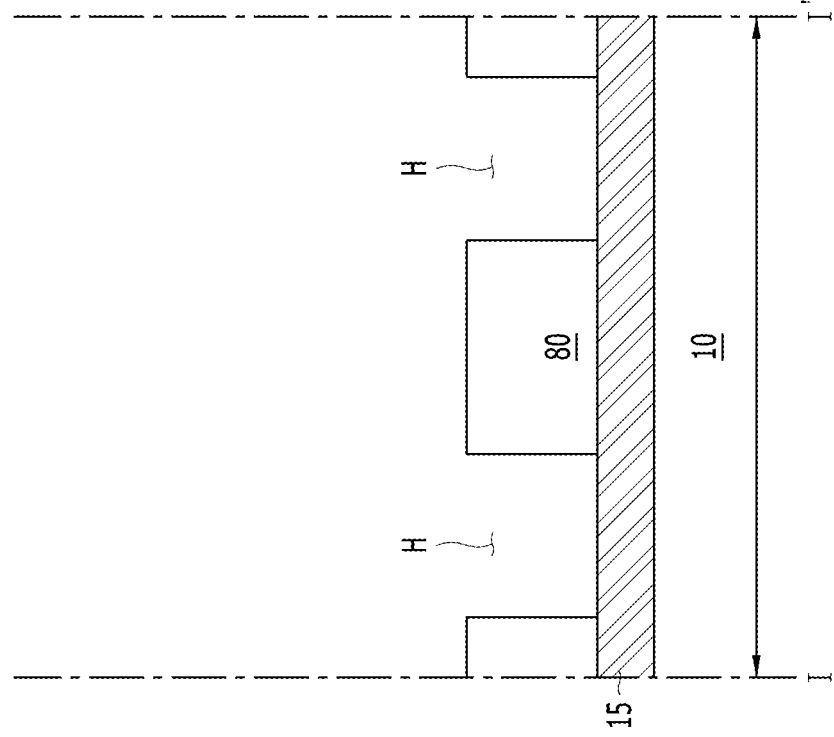

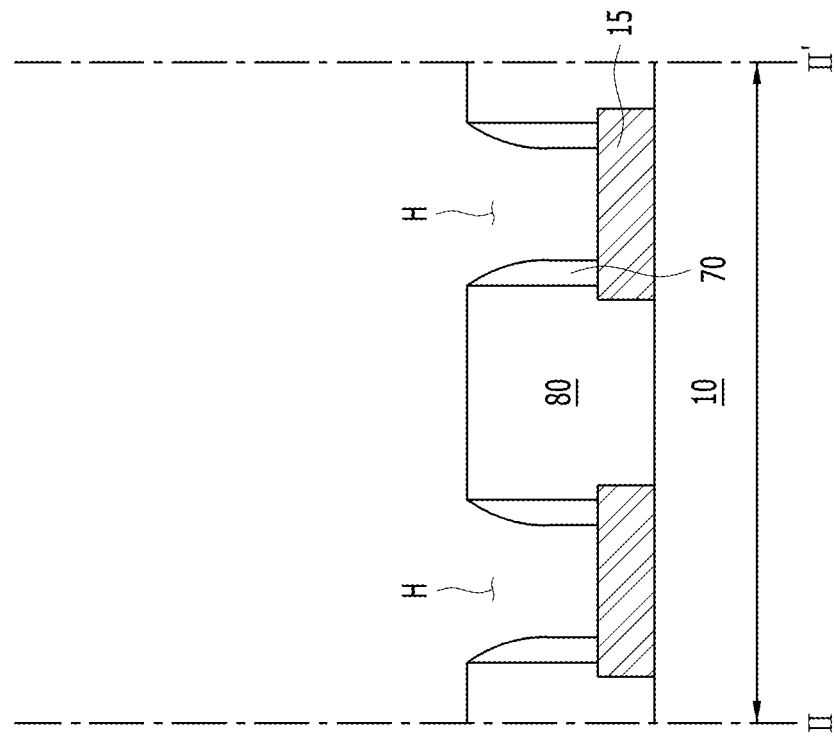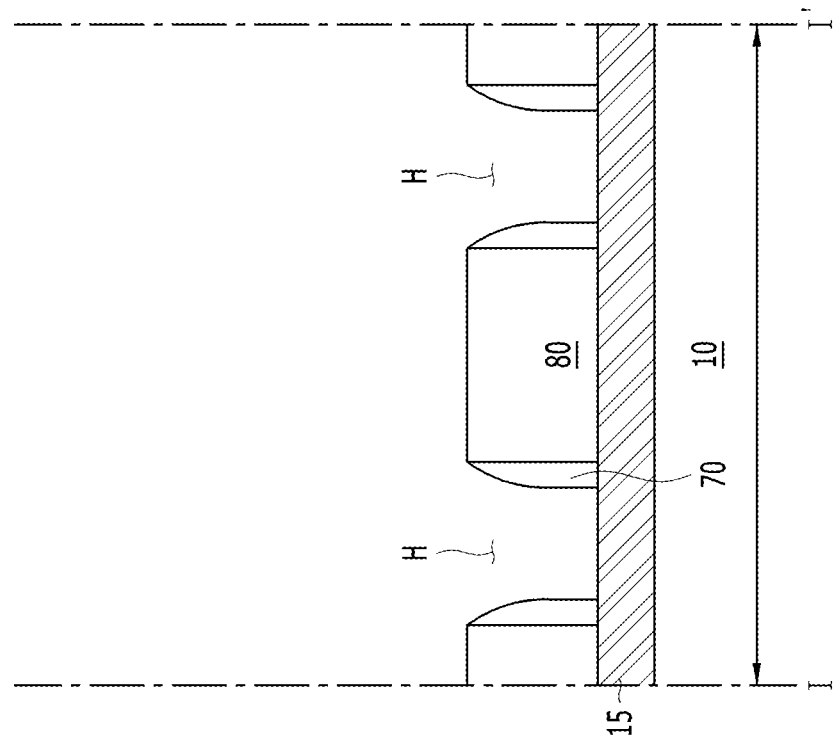

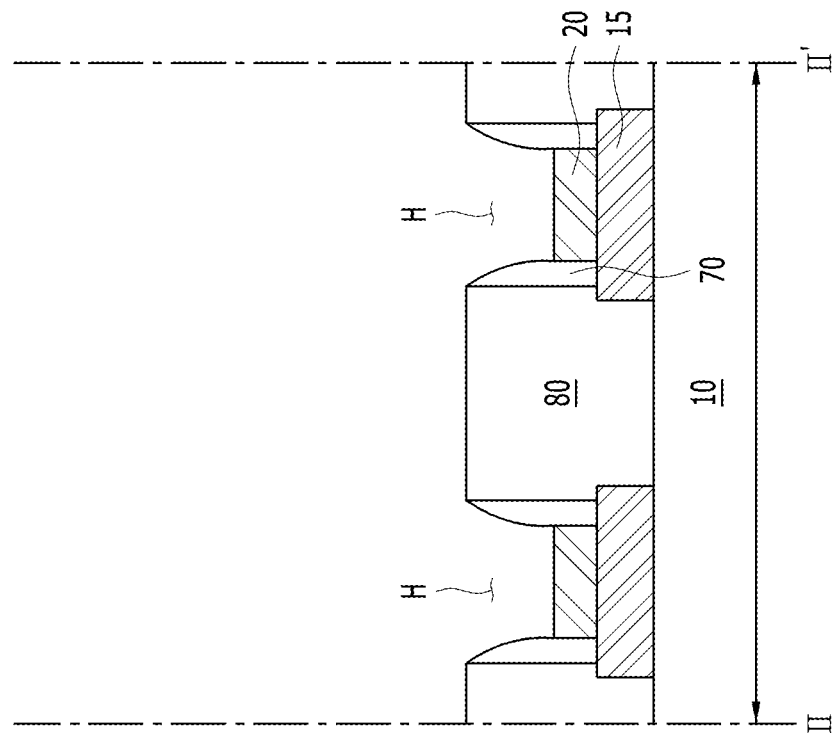
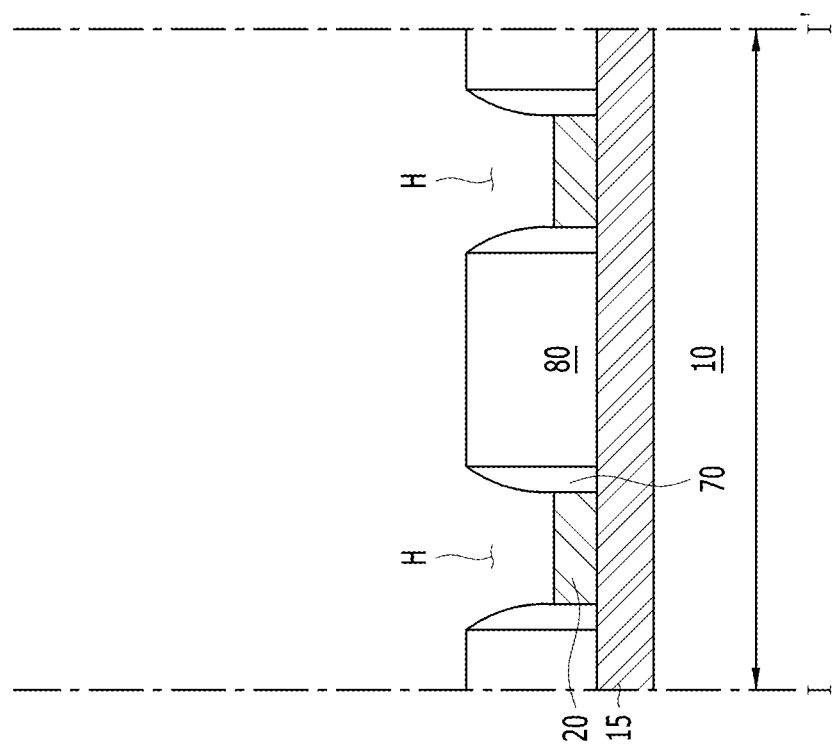

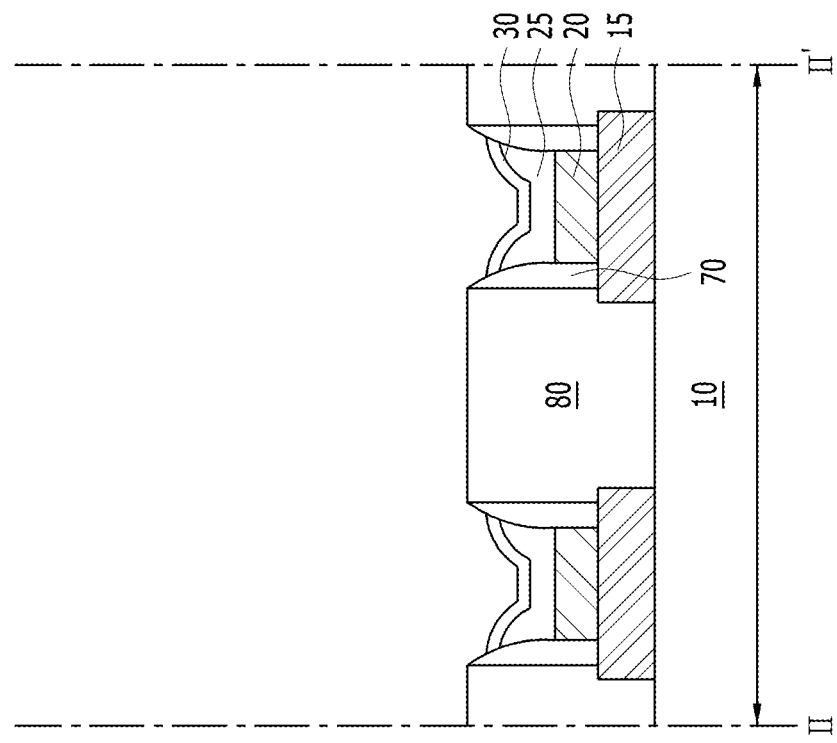
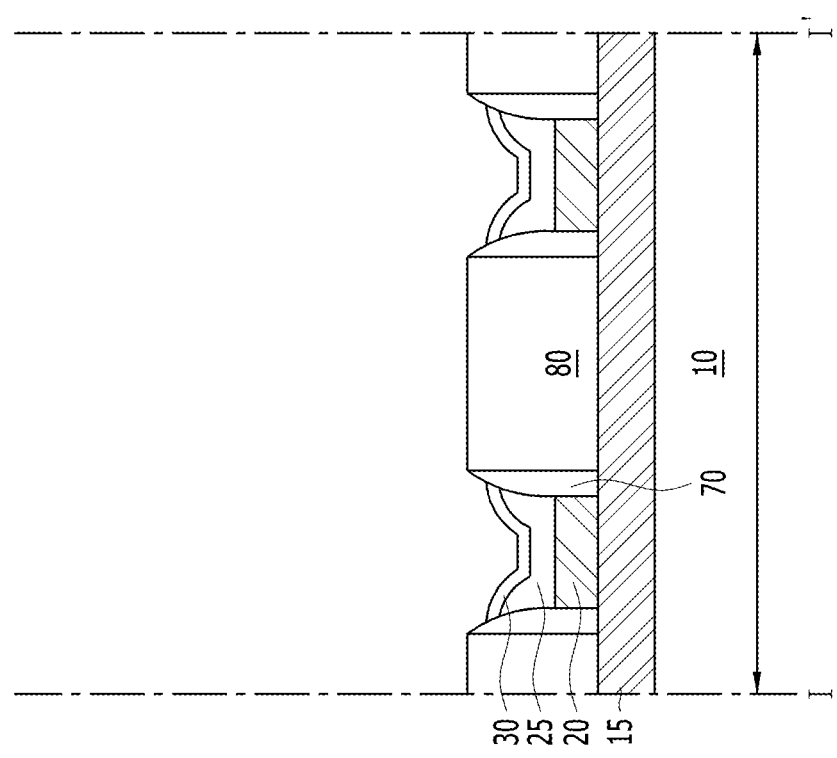

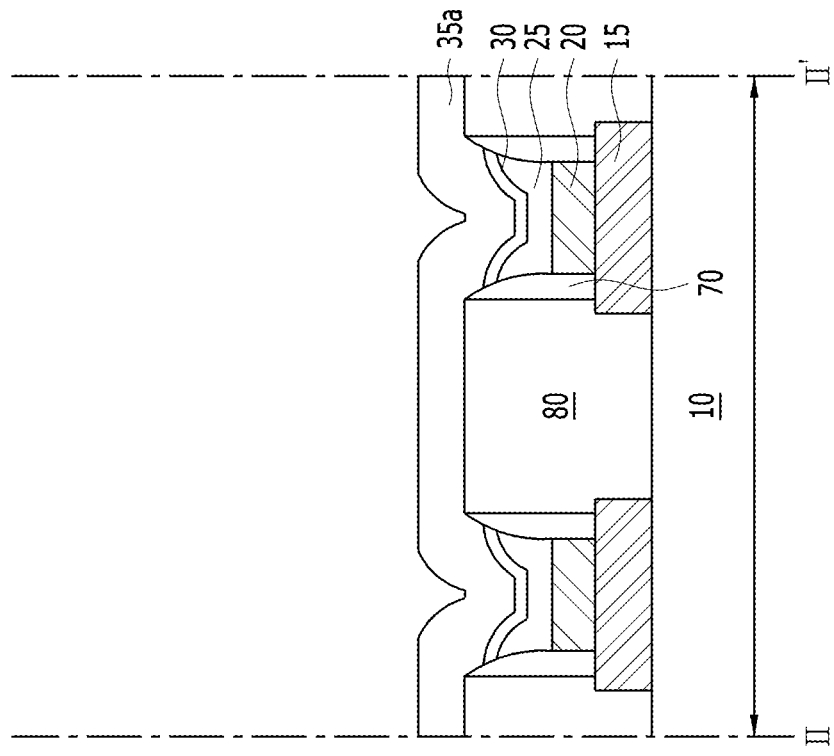
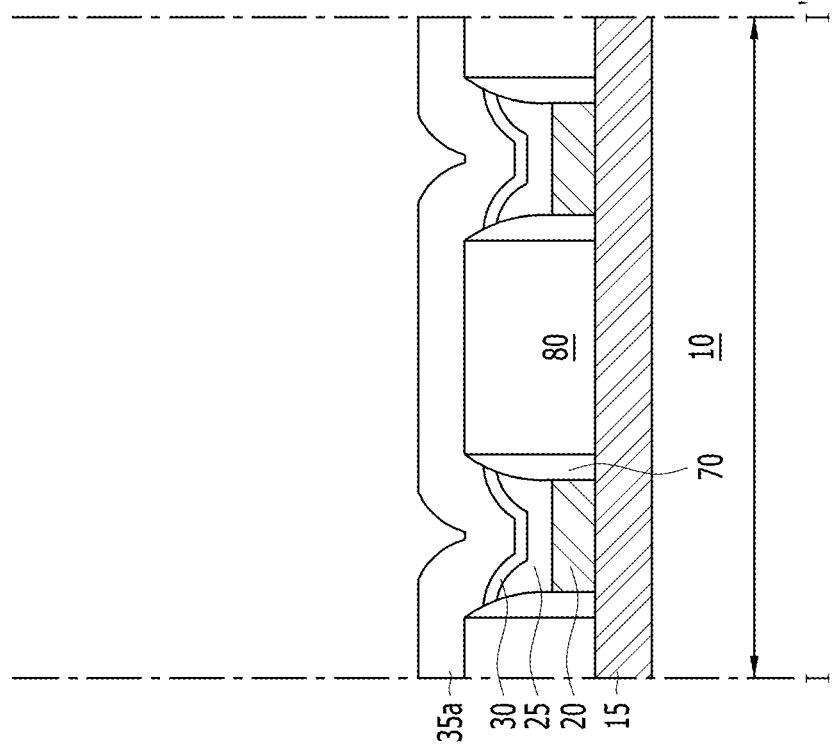

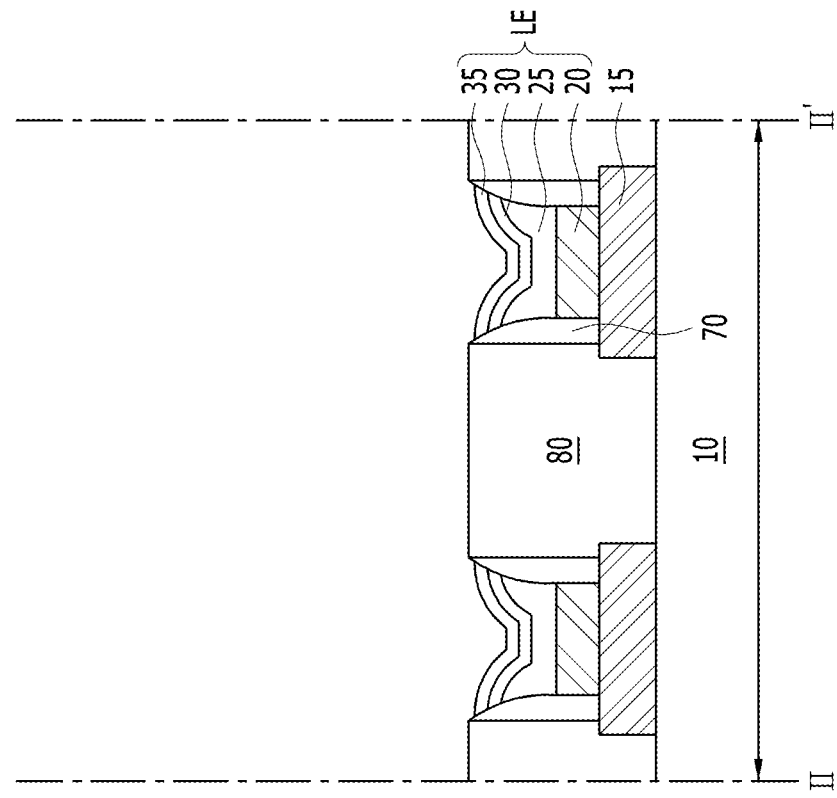
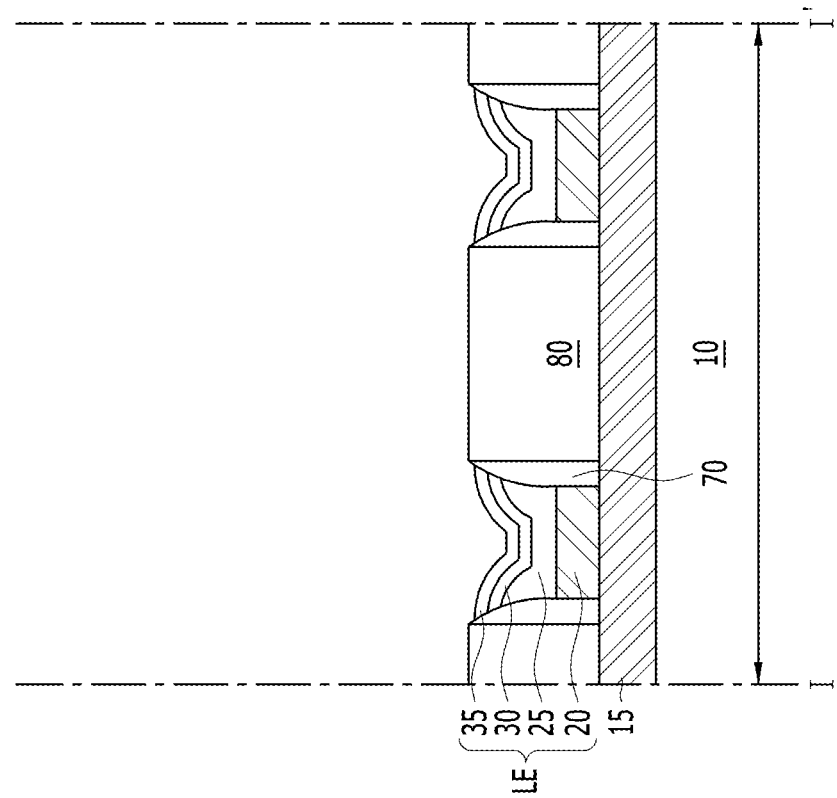

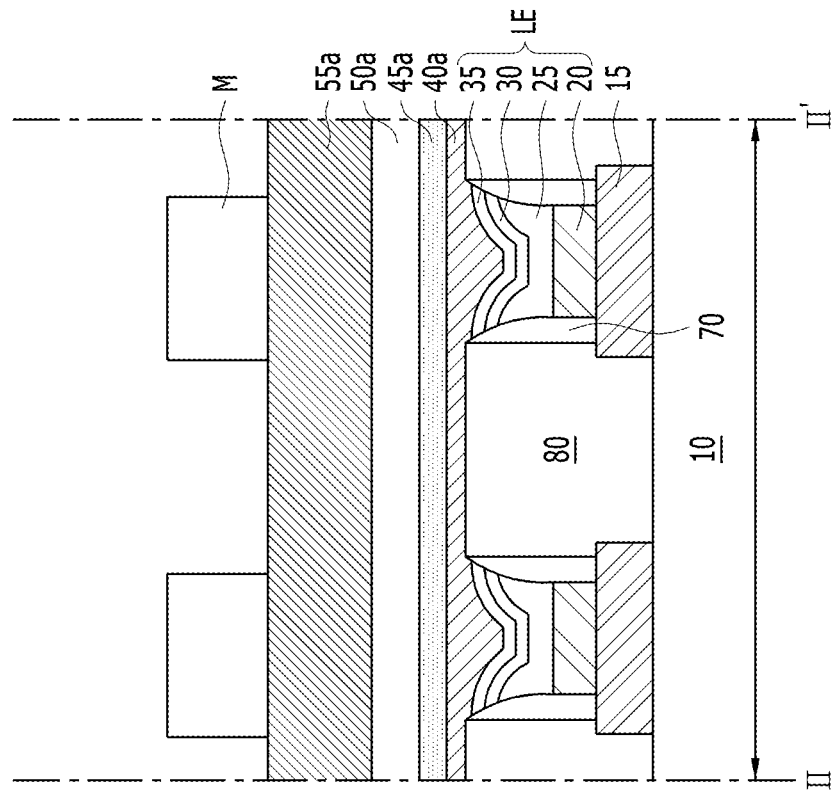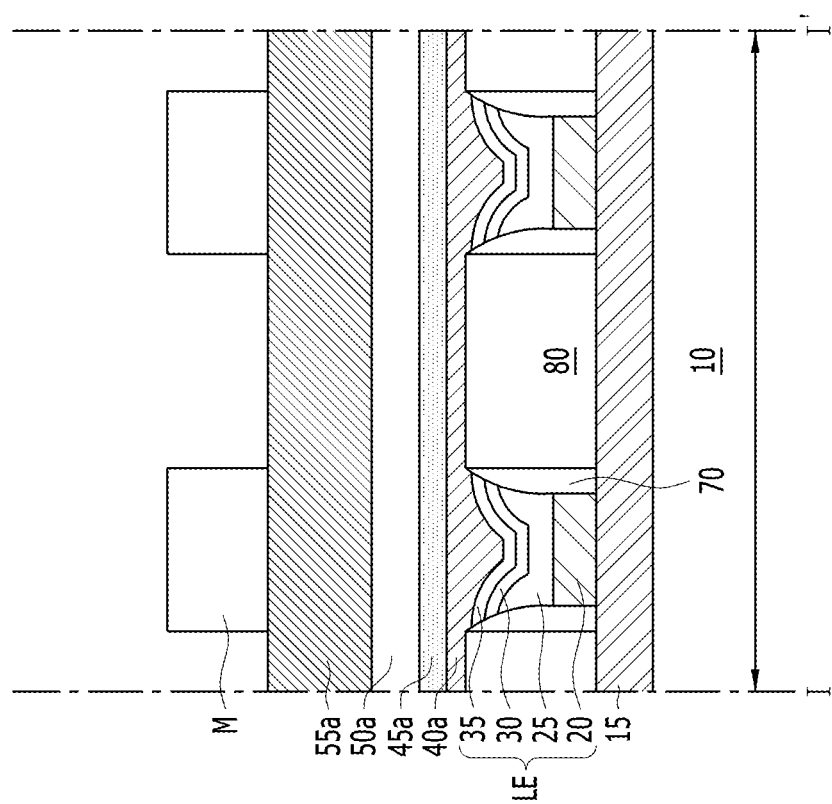

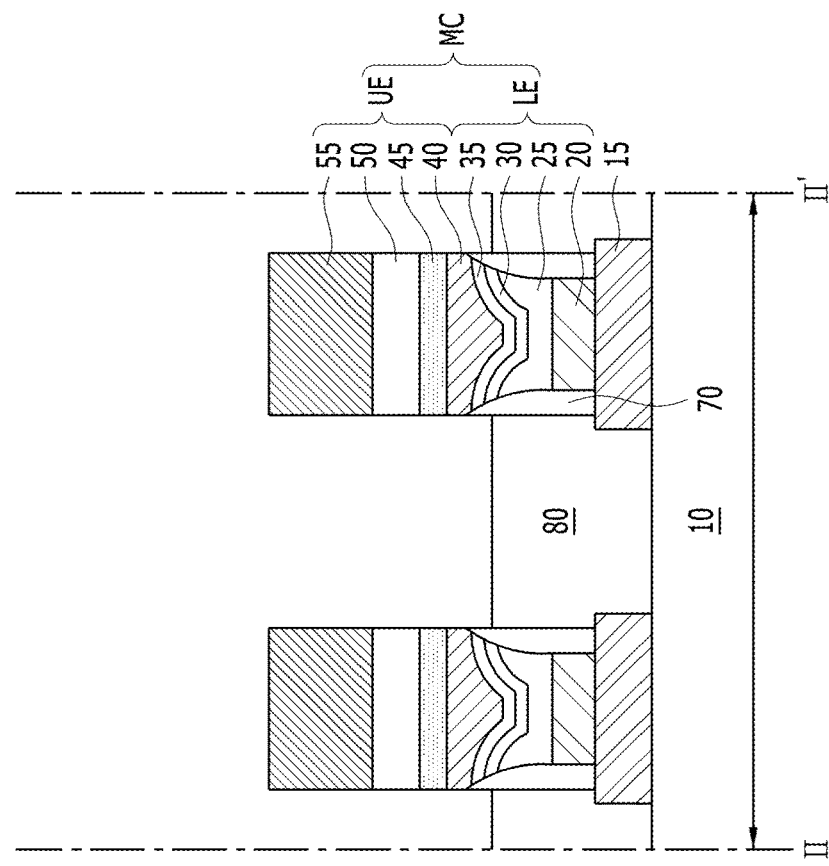
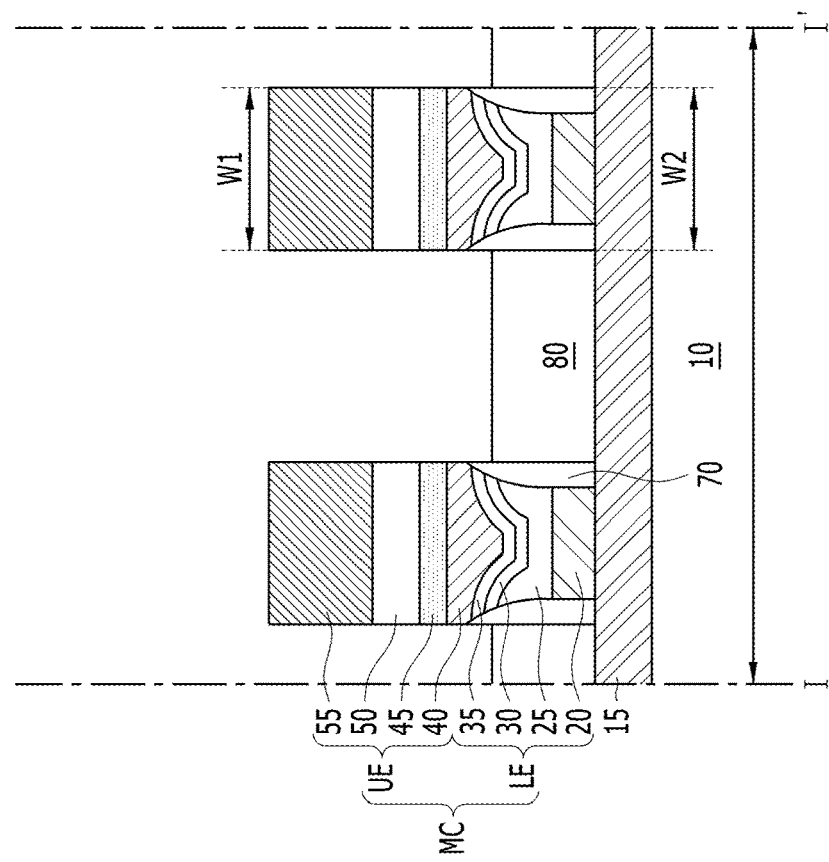

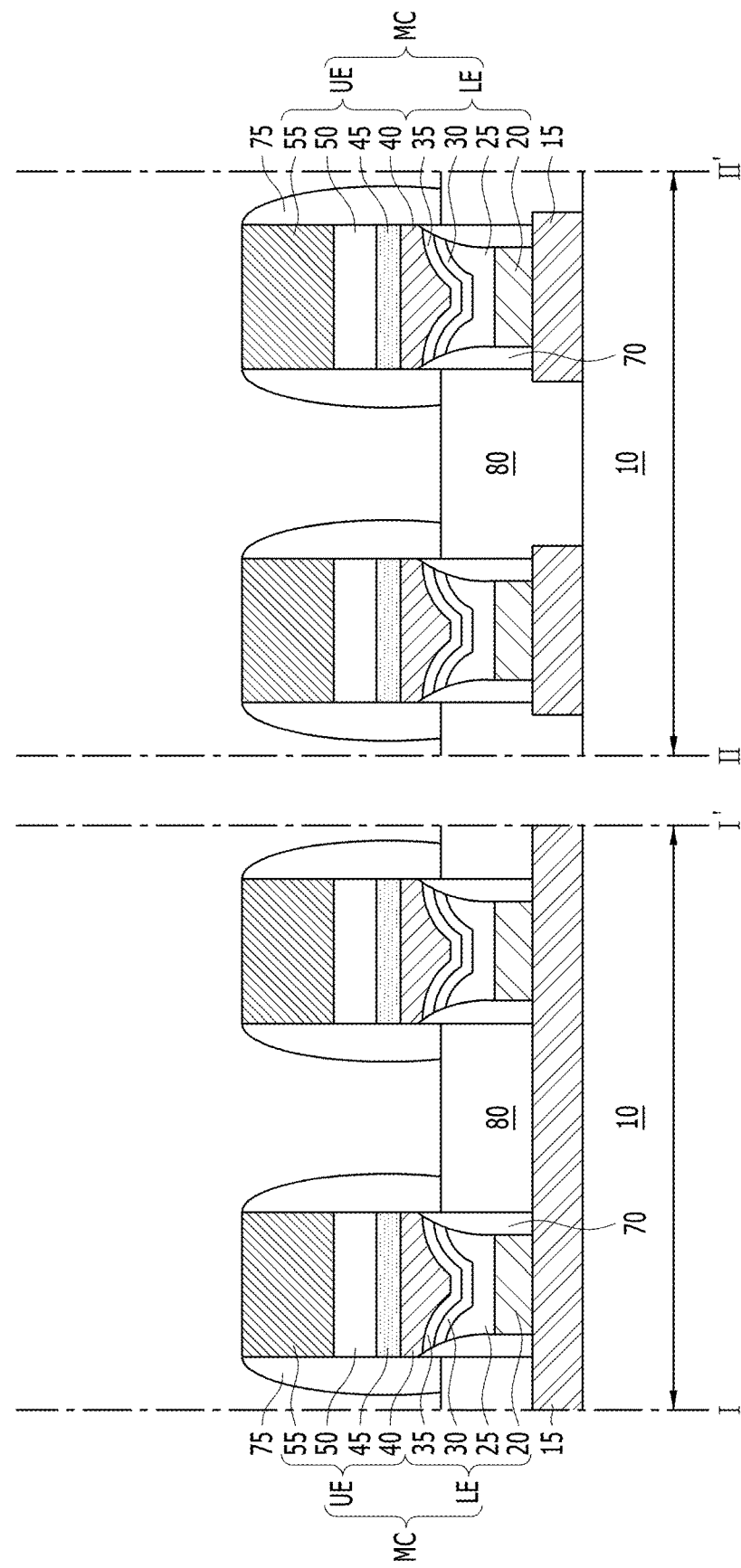

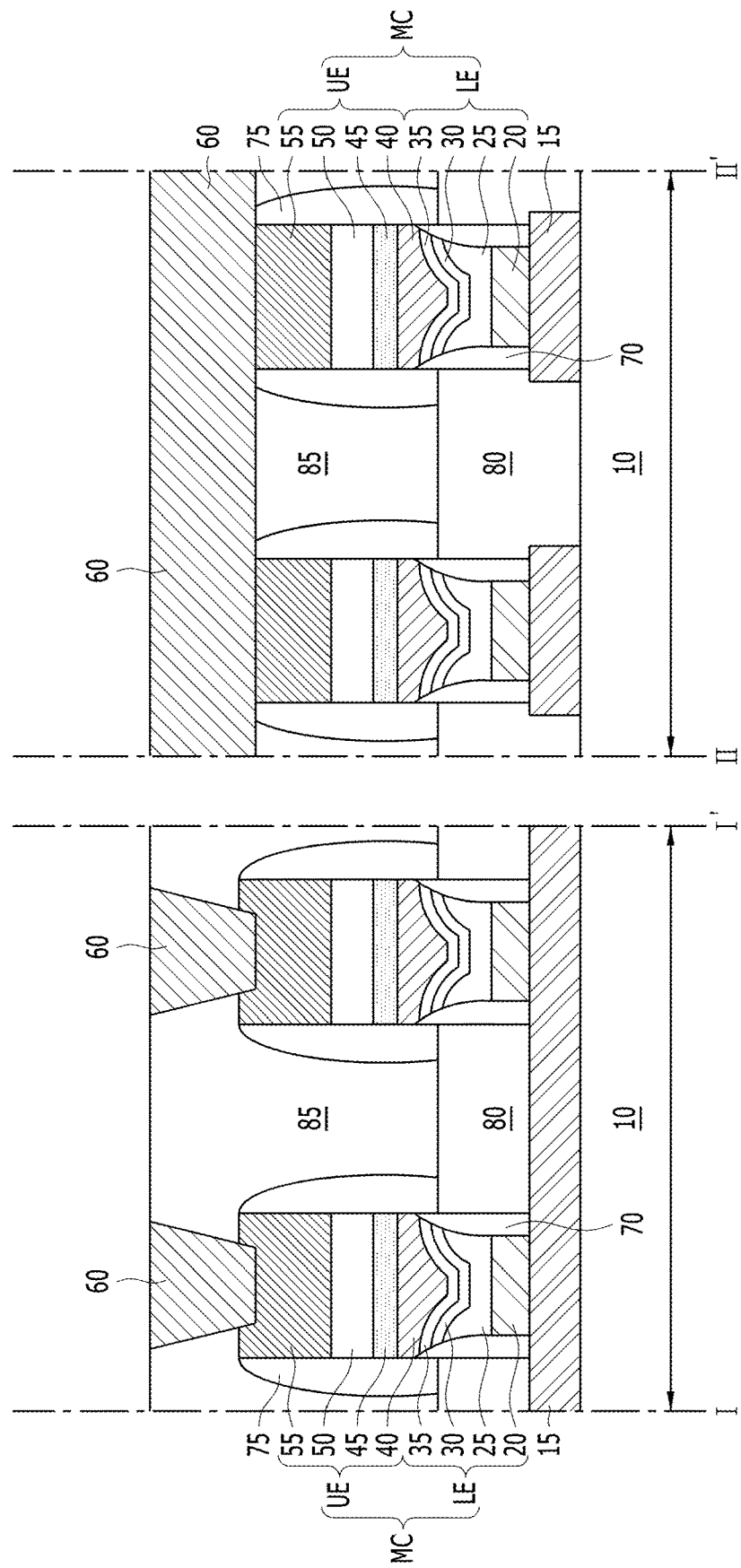

FIG. 23A
100E
MC
LE UE
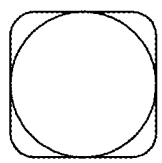 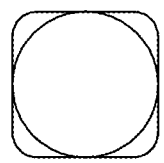 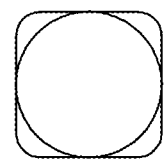 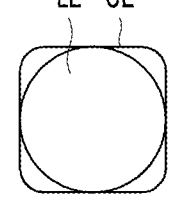
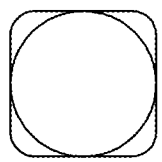 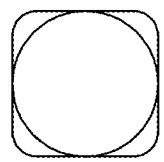 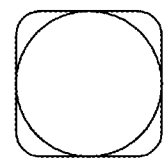 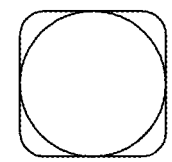
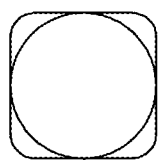 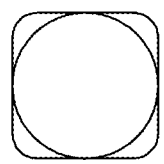 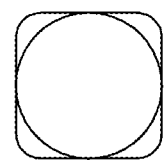 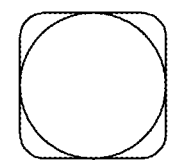
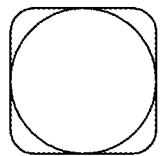 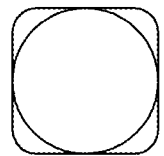 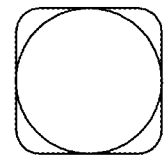 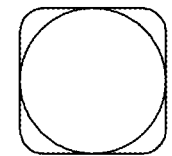

_US 10,411,070 B2_

SEMICONDUCTOR MEMORY DEVICE INCLUDING A SELECTION ELEMENT PATTERN CONFINED TO A HOLE

CROSS-REFERENCE TO RELATED APPLICATIONS

The present application claims priority to Korean Patent Application No. 10-2017-0156377, filed on Nov. 22, 2017, which is incorporated herein by reference in its entirety.

BACKGROUND

1. Field

Embodiments of the present disclosure relate to cross-point type semiconductor memory devices, which each include a lower electrode and a selection element pattern that are confined to a hole, as well as methods for forming the cross-point type semiconductor memory devices.

2. Description of the Related Art

A variable resistive memory device is a type of semiconductor memory device that switches between a low resistance state and a high resistance state. For example, the variable resistive memory device may include one of a Resistive Random Access Memory (ReRAM), a Phase Changeable Random Access Memory (PCRAM), a Spin Transfer Torque Magneto-resistive Random Access Memory (STT-MRAM), or another type of variable resistive semiconductor memory device.

A variable resistive memory device may have a cross-point arrangement. For example, a variable resistive memory device may include a first set of lines extending in a first direction, a second set of lines extending in a second direction that crosses the first direction, and a plurality of variable resistive memory elements arranged in rows and columns where the first and second lines intersect.

Since a cross-point arrangement type memory device has a simple structure and nonvolatile characteristics compared to DRAM (Dynamic Random Access Memories), it is attracting attention as one of next generation semiconductor memory devices.

SUMMARY

Embodiments of the present disclosure provide a cross-point type semiconductor memory device including a selection element pattern that is confined to, or buried in, a hole.

Embodiments of the present disclosure provide a cross-point type semiconductor memory device including a selection element pattern having a bowl shape.

Embodiments of the present disclosure provide a cross-point type semiconductor memory device including an intermediate electrode having a flat top surface.

Embodiments of the present disclosure provide a cross-point type semiconductor memory device including a memory cell stack, an upper width of the memory cell stack being wider than a lower width of the memory cell stack.

Embodiments of the present disclosure provide methods for forming a cross-point type semiconductor memory device including a selection element pattern that is confined to, or buried in, a hole.

Embodiments of the present disclosure provide methods for forming a cross-point type semiconductor memory device including a selection element pattern having a bowl shape.

Embodiments of the present disclosure provide methods for forming a cross-point type semiconductor memory device including an intermediate electrode having a flat top surface.

Embodiments of the present disclosure provide methods for forming a cross-point type semiconductor memory device that includes a memory cell stack, an upper width of the memory cell stack being wider than a lower width of the memory cell stack.

Embodiments of the present disclosure provide electronic devices and electronic systems including the semiconductor memory device.

In accordance with an embodiment of the present disclosure, an electronic device may include a semiconductor memory device. The semiconductor memory device may include a lower interlayer insulating layer having a hole; an upper interlayer insulating layer disposed on the lower interlayer insulating layer; and a memory cell stack including a lower element and an upper element, the lower element being confined to the hole of the lower interlayer insulating layer, the upper element being surrounded by the upper interlayer insulating layer. The lower element may include a lower electrode and a selection element pattern disposed on the lower electrode. The upper element may include a memory pattern disposed on the selection element pattern and an upper electrode disposed on the memory pattern.

In accordance with an embodiment of the present disclosure, an electronic device may include a semiconductor memory device. The semiconductor memory device may include a lower interlayer insulating layer having a hole; a lower spacer disposed in the hole of the lower interlayer insulating layer; a lower pillar disposed in the hole and confined by the lower spacer; an upper pillar disposed on the lower pillar; an upper spacer disposed on a sidewall of the upper spacer; and an upper interlayer insulating layer surrounding the upper spacer and being disposed on the lower interlayer insulating layer. The lower pillar may include a lower electrode and a selection element pattern disposed on the lower electrode. The upper pillar includes a memory pattern and an upper electrode disposed on the memory pattern. A horizontal width of the upper pillar is greater than a horizontal width of the lower pillar.

BRIEF DESCRIPTION OF THE DRAWINGS

FIGS. 3A and 3B to 6A and 6B are schematic illustrations of longitudinal cross-sections of semiconductor memory devices in accordance with embodiments of the present disclosure.

FIGS. 7A and 7B to FIGS. 21A and 21B are schematic illustrations of a semiconductor memory device being fabricated by a method in accordance with an embodiment of the present disclosure.

FIGS. 23A to 23C are schematic illustrations showing top views of lower elements and upper elements of memory cell stacks in accordance with various embodiments of the present disclosure.

DETAILED DESCRIPTION

Figure 1:
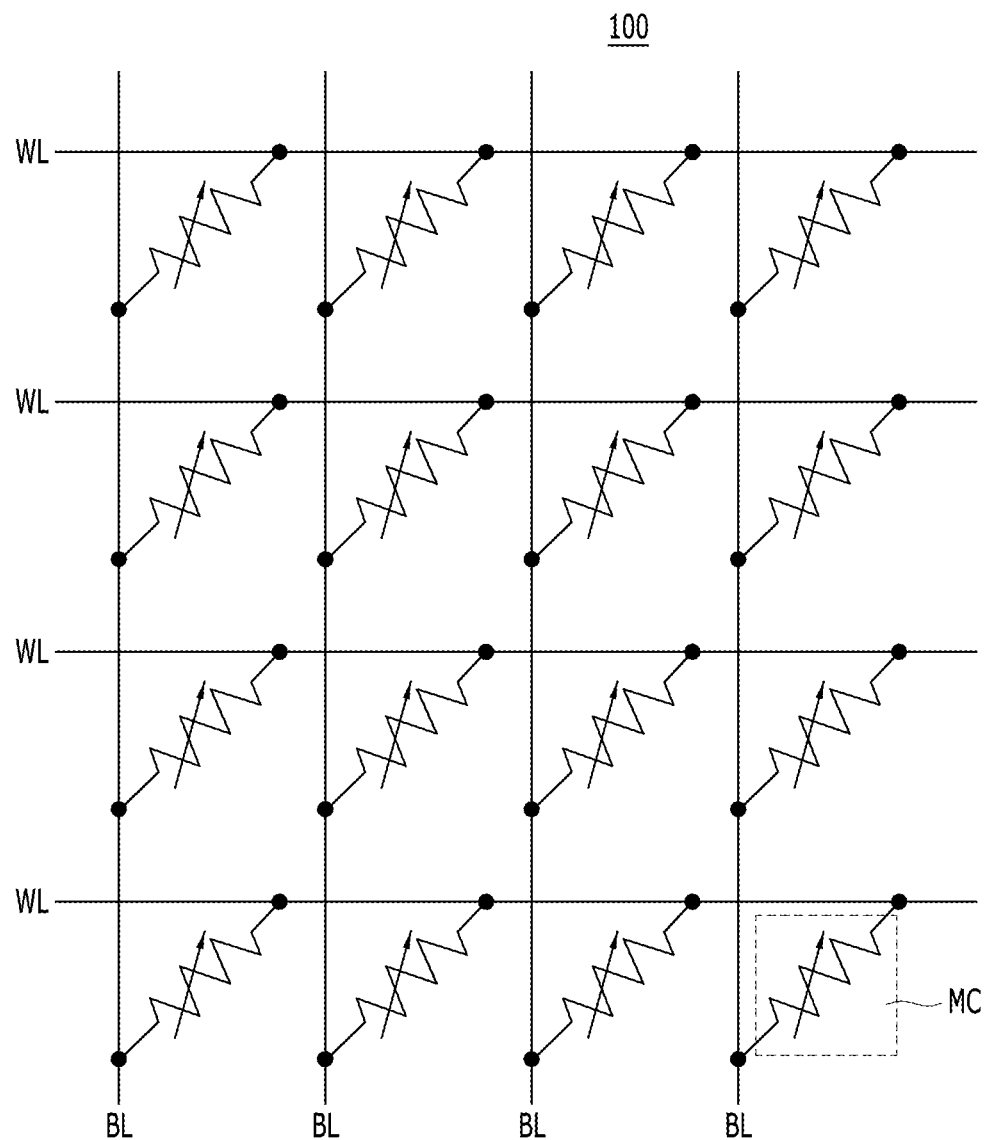
FIG. 1 is a schematic circuit diagram of a semiconductor memory device in accordance with an embodiment of the present disclosure.

Various embodiments will be described below in more detail with reference to the accompanying drawings. Embodiments of the present disclosure may, however, be embodied in different forms and should not be construed as being limited to the embodiments set forth herein. Rather, the embodiments set forth herein are provided so that this disclosure will be thorough and complete, and will fully convey the scope of the present disclosure to those skilled in the art.

The terms used in this specification are only used for describing exemplary embodiments, and do not limit the present invention. The terms that have a singular form may include plural forms unless referred to the contrary. The meaning of 'comprise' and 'comprising' used in this specification specifies a component, step, operation, and/or element but does not exclude other components, steps, operations, and/or elements.

Throughout the specification, like reference numerals refer to the same elements. Therefore, although the same or similar reference numerals are not mentioned or described in the corresponding drawing, the reference numerals may be described with reference to other drawings. Furthermore, although elements are not represented by reference numerals, the elements may be described with reference to other drawings.

FIG. 1 is a schematic circuit diagram of a semiconductor memory device 100 in accordance with an embodiment of the present disclosure. Referring to FIG. 1, the semiconductor memory device 100 may include a plurality of word lines WL, a plurality of bit lines BL, and a plurality of memory cell stacks MC.

The plurality of word lines WL may extend in a first direction and may be in parallel. The plurality of bit lines BL may extend in a second direction and may be in parallel. The second direction may be perpendicular to the first direction. In another embodiment, the plurality of word lines WL may extend in the second direction and be in parallel with each other, and the bit lines BL may extend in the first direction and be in parallel with each other.

The memory cell stacks MC may connect the plurality of word lines WL to the plurality of bit lines BL, and may be disposed in intersection regions between the plurality of word lines WL and the plurality of bit lines BL. The plurality of memory cell stacks MC may include variable resistance elements.

Figure 2:
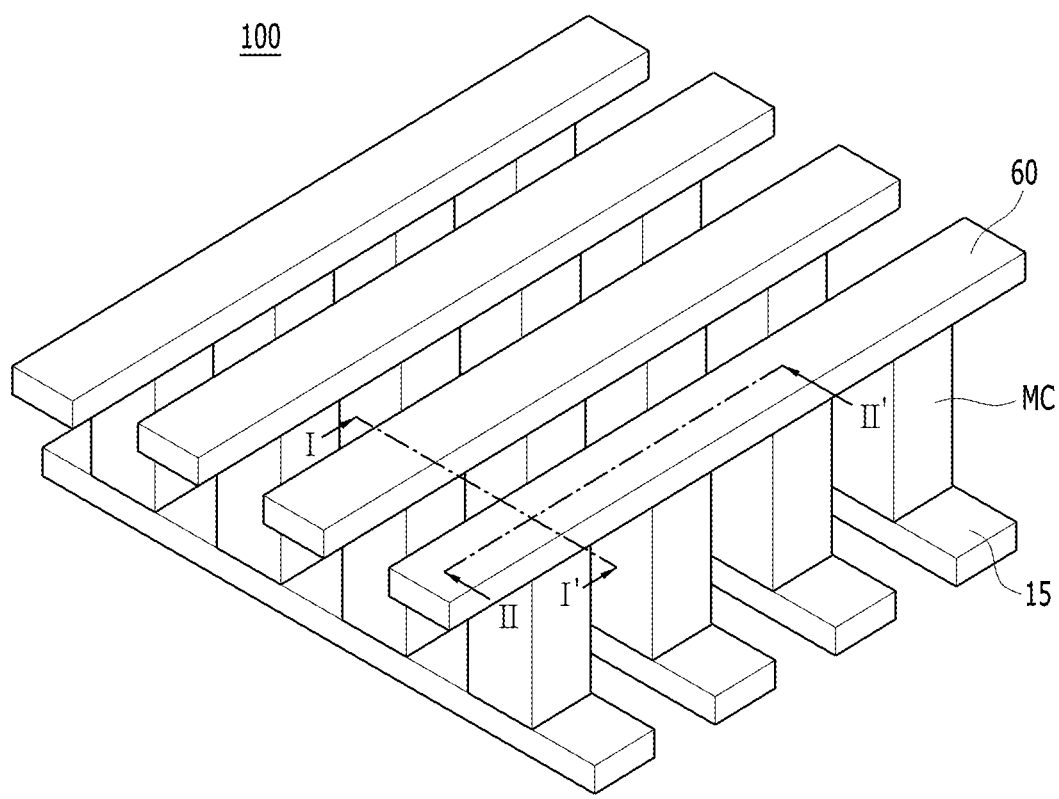
FIG. 2 is a schematic three-dimensional perspective view of a semiconductor memory device in accordance with an embodiment of the present disclosure.

FIG. 2 is a schematic, three-dimensional perspective view of the semiconductor memory device 100 of FIG. 1 in accordance with an embodiment of the present disclosure. Referring to FIG. 2, the semiconductor memory device 100 may include a plurality of lower conductive interconnections 15, a plurality of upper conductive interconnections 60, and a plurality of memory cell stacks MC.

The plurality of lower conductive interconnections 15 may extend in a first horizontal direction, and may be in parallel with each other. With further reference to FIG. 1, the plurality of lower conductive interconnections 15 may be the word lines WL. In another embodiment of the present disclosure, the plurality of lower conductive interconnections 15 may be the bit lines BL.

The plurality of upper conductive interconnections 60 may extend in a second horizontal direction that is perpendicular to the first horizontal direction, and may be in parallel with each other. That is, in a top view, the plurality of lower conductive interconnections 15 and the plurality of upper conductive interconnections 60 may be orthogonal to each other, and may be arranged in a mesh shape. With further reference to FIG. 1, the plurality of upper conductive interconnections 60 may be the bit lines BL.

In another embodiment of the present disclosure, the plurality of upper conductive interconnections 60 may be the word lines WL.

The plurality of memory cell stacks MC may be vertically disposed in intersection regions between the plurality of lower conductive interconnections 15 and the plurality of upper conductive interconnections 60. The plurality of memory cell stacks MC may have pillar shapes.

FIGS. 3A and 3B to 6A and 6B are schematic illustrations of longitudinal cross-sections of semiconductor memory devices 100A-100D in accordance with embodiments of the present disclosure. FIGS. 3A, 4A, 5A, and 6A are longitudinal cross-sectional views taken along a line I-I' of FIG. 2, and FIGS. 3B, 4B, 5B, and 6B are longitudinal cross-sectional views taken along a line II-II' of FIG. 2.

Referring to FIGS. 3A and 3B, a semiconductor memory device 100A in accordance with an embodiment of the present disclosure may include a lower conductive interconnection 15 disposed on a lower layer 10, a memory cell stack MC stacked on the lower conductive interconnection 15, and an upper conductive interconnection 60 disposed on the memory cell stack MC.

The memory cell stack MC may include a lower element LE and an upper element UE. The lower element LE may include a lower electrode 20, a self-compliance unit pattern 25, a buffer electrode pattern 30, and a selection element pattern 35. The upper element UE may include an intermediate electrode 40, a memory pattern 45, a reservoir pattern 50, and an upper electrode 55.

The semiconductor memory device 100A may further include a lower spacer 70 that is disposed on and around sidewalls of the lower element LE of the memory cell stack MC, and an upper spacer 75 that is disposed on and around sidewalls of the upper element UE of the memory cell stack MC. An upper portion of the lower spacer 70 and a lower portion of the upper spacer 75 may be directly in contact with each other.

The semiconductor memory device 100A may further include a lower interlayer insulating layer 80 and an upper interlayer insulating layer 85. The lower interlayer insulating layer 80 is disposed on outer surfaces of the lower spacer 70, and may surround the lower spacer 70. The upper interlayer insulating layer 85 is disposed on outer surfaces of the upper spacer 75, and may surround the upper spacer 75. The lower interlayer insulating layer 80 may be in contact with a lower surface of the upper spacer 75. The upper interlayer insulating layer 85 may cover a portion of an upper surface of the memory cell stack MC.

The lower interlayer insulating layer 80 may have a hole H. The lower spacer 70 may be formed on inner sidewalls of the hole H. The lower element LE, which includes the lower electrode 20, the self-compliance unit pattern 25, the buffer electrode pattern 30, and the selection element pattern 35, may be defined by the lower spacer 70, and confined to the hole H with the lower spacer 70.

A part of a lower portion of the intermediate electrode 40 may be disposed in the hole H. Therefore, the lower element LE may further include the part of the lower portion of the intermediate electrode 40, which is disposed in the hole H.

The lower spacer 70 may have a hollow cylindrical shape surrounding the lower element LE of the memory cell stack MC. The upper spacer 75 may have a hollow cylindrical shape surrounding the upper element UE of the memory cell stack MC. For example, the lower spacer 70 and the upper spacer 75 may each have a circular disk shape, a polygonal ring shape, or both from a top view. In an embodiment, the lower spacer 70 and the upper spacer 75 may each have a cross-section in the shape of a circular disk. The lower spacer 70 and the upper spacer 75 may include silicon nitride, silicon oxynitride, or both. The lower spacer 70 may be disposed on the inner sidewall of the hole H, and the upper spacer 75 may be disposed on the outer sidewalls of the memory cell stack MC. That is, the lower spacer 70 may have a cylindrical outer surface that is substantially parallel to a vertical direction, and the upper spacer 75 may have a cylindrical inner surface that is substantially parallel to the vertical direction. However, an inner surface of the lower spacer 70 may curve radially outward along an upward direction, and an outer surface of the upper spacer 75 may curve radially inward along the upward direction.

The lower interlayer insulating layer 80 may be in contact with the outer surface of the lower spacer 70 and a bottom surface of the upper spacer 75. The upper interlayer insulating layer 85 may be in contact with the outer surface of the upper spacer 75 and an upper surface of the lower interlayer insulating layer 80.

The upper interlayer insulating layer 85 may be thick enough to sufficiently cover the memory cell stack MC and the upper spacer 75. That is, the upper interlayer insulating layer 85 may be thick enough to separate the upper spacer 75 of the memory cell stack MC from an upper spacer 75 of an adjacent memory cell stack MC in the semiconductor memory device 100A. The lower interlayer insulating layer 80 and the upper interlayer insulating layer 85 may each include silicon oxide. A top end of the lower spacer 70 may upwardly protrude from the lower interlayer insulating layer 80, such that the top end of the lower spacer 70 is located at a higher level than a top surface of the lower interlayer insulating layer 80.

Thus, for example, the lower element LE of the memory cell stack MC and the lower spacer 70 surrounding the lower element LE may be disposed in a lower portion of the hole H, and a portion of the upper element UE of the memory cell stack MC may be disposed in an upper portion of the hole H.

The lower layer 10 may be a substrate, a base insulating layer, or both. For example, when the lower layer 10 is a substrate, the lower conductive interconnections 15 may be embedded in the lower layer 10. When the lower layer 10 is a base insulating layer, the lower conductive interconnections 15 may be embedded in the base insulating layer, disposed above the base insulating layer, or both.

The lower conductive interconnections 15 may each have a line shape extending in a first horizontal direction. The lower conductive interconnections 15 may include a metal, such as tungsten (W), aluminum (Al), or copper (Cu); a metal compound, such as titanium nitride (TiN), tantalum nitride (TaN), or tungsten nitride; a conductive material, such as a metal silicide or a metal alloy; or a combination thereof. A portion of the upper surface of the lower conductive interconnection 15 may be exposed by the hole H.

The lower electrode 20 may be formed in the hole H on the exposed portion of the lower conductive interconnection 15. The lower electrode 20 may have a via plug shape, such as a circular or polygonal mesa shape. In another embodiment of the present disclosure, the lower electrode 20 may be have a bowl shape, and may have an upper surface that is concave. A lower surface of the lower electrode 20 may be in contact with the lower conductive interconnection 15, and side surfaces of the lower electrode 20 may be in contact with the lower spacer 70. The lower electrode 20 may include a metal, such as tungsten (W), aluminum (Al), or copper (Cu); a metal compound, such as titanium nitride (TiN), tantalum nitride (TaN), or tungsten nitride (WN); a conductive material, such as a metal silicide or a metal alloy; or a combination thereof.

The self-compliance unit pattern 25 may be formed on the lower electrode 20 in the hole H by being limited by the lower spacer 70. The self-compliance unit pattern 25 may have a bowl shape. For example, the self-compliance unit pattern 25 may have a concave upper surface. In another embodiment of the present disclosure, the self-compliance unit pattern 25 may have a mesa shape having a flat upper surface. The self-compliance unit pattern 25 may include a hafnium-based material, such as hafnium oxide (HfO$_x$). The self-compliance unit pattern 25 may block overcurrent flowing in the memory cell stack MC.

The buffer electrode pattern 30 may be formed on the self-compliance unit pattern 25 in the hole H, and may be confined by the lower spacer 70. The buffer electrode pattern 30 may also have a bowl shape. For example, the buffer electrode pattern 30 may have a concave upper surface. In another embodiment of the present disclosure, the buffer electrode pattern 30 may have a mesa shape, and may have a flat upper surface. The buffer electrode pattern 30 may block atoms from diffusing between the self-compliance unit pattern 25 and the selection element pattern 35. The buffer electrode pattern 30 may include a metal, such as tungsten (W), aluminum (Al), or copper (Cu); a metal compound, such as titanium nitride (TiN), tantalum nitride (TaN), or tungsten nitride (WN); a conductive material, such as a metal silicide or a metal alloy; or a combination thereof.

The selection element pattern 35 may be disposed in the hole H on the buffer electrode pattern 30, and may be confined by the lower spacer 70. The selection element pattern 35 may also have a bowl shape. For example, the selection element pattern 35 may have a concave upper surface. In another embodiment of the present disclosure, the selection element pattern 35 may have a mesa shape having a flat upper surface. The selection element pattern 35 may generate a current path, or block current from flowing in the memory cell stack MC, based on an electric potential, such as a voltage. The selection element pattern 35 may include one or more of ion doped silicon, ion doped oxide, and ion doped nitride. For example, the ions may include one or more materials selected from the group consisting of boron (B), carbon (C), nitrogen (N), arsenic (As), phosphorous (P), silicon (Si), germanium (Ge), gallium (Ga), and another ion-implantable material. The oxide may include one or more of silicon oxide ($SiO_2$), aluminum oxide ($Al_2O_3$), zirconium oxide ($ZrO_2$), titanium oxide ($TiO_2$), and another oxide. The nitride may include silicon nitride ($Si_3N_4$), another material, or both. For example, the selection element pattern 35 may include silicon oxide doped with arsenic (As) ions.

The intermediate electrode 40 may have a lower portion disposed in the hole H and an upper portion disposed outside of the hole H. The lower portion of the intermediate electrode 40 may be disposed in the hole H and on the concave upper surface of the selection element pattern 35. The lower portion of the intermediate electrode 40 may downwardly protrude into the hole H. In another embodiment of the present disclosure, a lower surface of the intermediate electrode 40 may be flat. The upper portion of the intermediate electrode 40 may be located at a higher level than the upper surface of the lower interlayer insulating layer 80 and the top end of the lower spacer 70. An upper surface of the intermediate electrode 40 may be flat. The intermediate electrode 40 may include a metal, such as tungsten (W), aluminum (Al), or copper (Cu); a metal compound, such as titanium nitride (TiN), tantalum nitride (TaN), or tungsten nitride (WN); a conductive material, such as a metal silicide or a metal alloy; another material; or a combination thereof.

As described above, the lower electrode 20, the self-compliance unit pattern 25, the buffer electrode pattern 30, and the selection element pattern 35 may each have a bowl shape, may each be disposed in the hole H, and may each be confined by the lower spacer 70.

The memory pattern 45 may be stacked on the intermediate electrode 40, and may have a mesa shape. The memory pattern 45 may include any variable resistive cell that can be used in a variable resistive semiconductor device. A resistance value of the memory pattern 45 may vary depending on the content of oxygen in the memory pattern 45. For example, the memory pattern 45 may include a metal oxide, such as hafnium oxide ($HfO_2$), tantalum oxide ($Ta_2O_5$), titanium oxide ($TiO_2$), zirconium oxide (ZrO), or zinc oxide (ZnO); a phase-changeable material, such as a GST (GeSbTe) or a chalcogenide material; a mechanical variable resistive material, such as a conductive bridging material; a memristor material; or a combination thereof.

The reservoir pattern 50 may include a material capable of providing and/or storing oxygen atoms, oxygen ions, or both. For example, the reservoir pattern 50 may include a metal, such as tantalum (Ta) or titanium (Ti). The memory pattern 45 and the reservoir pattern 50 may form a variable resistance element. For example, oxygen atoms in the memory pattern 45 may move to the reservoir pattern 50 and may be stored in the reservoir pattern 50. In an embodiment, oxygen atoms stored in the reservoir pattern 50 may move to the memory pattern 45. The presence of oxygen atoms in the memory pattern 45 may affect an electrical resistance of the memory pattern 45. Accordingly, the variable resistive element can have a high resistance state or a low resistance state.

The upper electrode 55 may be stacked on the reservoir pattern 50, and may have a mesa shape. A top surface of the upper electrode 55 may be flat. In an embodiment, a portion of an upper surface of the upper electrode 55 may be recessed. The recessed portion of the upper surface of the upper electrode 55 may be in contact with the upper conductive interconnection 60. The upper electrode 55 may include a metal, such as tungsten (W), aluminum (Al), or copper (Cu); a metal compound, such as titanium nitride (TiN), tantalum nitride (TaN), or tungsten nitride (WN); a conductive material, such as a metal silicide or a metal alloy; or a combination thereof.

The upper conductive interconnection 60 may vertically penetrate the upper interlayer insulating layer 85, and may connect to the upper electrode 55 of the memory cell stack MC. The upper conductive interconnection 60 may have a line shape extending in a second horizontal direction that is perpendicular to the first horizontal direction. A bottom end of the upper conductive interconnection 60 may protrude downward from the upper surface of the upper electrode 55. That is, a portion of the upper conductive interconnection 60 may be protrude into the upper electrode 55. The upper conductive interconnections 60 may include a metal, such as tungsten (W), aluminum (Al), or copper (Cu); a metal compound, such as titanium nitride (TiN), tantalum nitride (TaN), or tungsten nitride (WN); a conductive material, such as a metal silicide or a metal alloy; or a combination thereof.

The semiconductor memory device 100A may further include a capping insulating layer 65 disposed on the upper conductive interconnection 60 and the upper interlayer insulating layer 85. The capping insulating layer 65 may physically and mechanically fix the upper conductive interconnection 60 and the upper interlayer insulating layer 85, and may protect the upper conductive interconnection 60 and the upper interlayer insulating layer 85 from electrical, chemical, and physical damage. The capping insulating layer 65 may include a denser and harder material than the upper interlayer insulating layer 85, such as silicon nitride, silicon oxynitride, or a combination thereof.

In the embodiment of the present disclosure, components of the lower element LE of the memory cell stack MC, for example, the self-compliance unit pattern 25, the buffer electrode pattern 30, and the selection element pattern 35, may each have a bowl shape. That is, each of the components of the lower element LE may have a concave upper surface. Furthermore, components of the upper element UE of the memory cell stack MC, for example, the intermediate electrode 40, the memory pattern 45, the reservoir pattern 50, and the upper electrode 55, may each have a mesa shape. That is, each of the components of the upper element UE may have a flat upper surface. In another embodiment of the present disclosure, the lower electrode 20 may also have a bowl shape. That is, the lower electrode 20 may have a concave upper surface.

The memory cell stack MC may have a pillar shape. For example, the lower element LE formed in the hole H may be a lower portion of the pillar shape, and the upper element UE may be an upper portion of the pillar shape. An average horizontal width of the upper element UE may be greater than an average horizontal width of the lower element LE. According to an embodiment, the maximum horizontal width of the lower element LE may be equal to the average horizontal width of the upper element UE or the minimum horizontal width of the upper element UE.

Referring to FIGS. 4A and 4B, a semiconductor memory device 100B in accordance with an embodiment of the present disclosure may include a memory cell stack MC.

Unlike the memory stack MC of the semiconductor memory device 100A shown in FIGS. 3A and 3B, the memory stack MC of the semiconductor memory device 100B does not include the self-compliance unit pattern 25 and the buffer electrode pattern 30. For example, a lower element LE of the semiconductor memory device 100B may include a lower electrode 20 and a selection element pattern 35 that is disposed directly on the lower electrode 20. The lower electrode 20 may have a mesa shape or a bowl shape, and may be confined by a lower spacer 70 in a hole H.

Figure 5A:
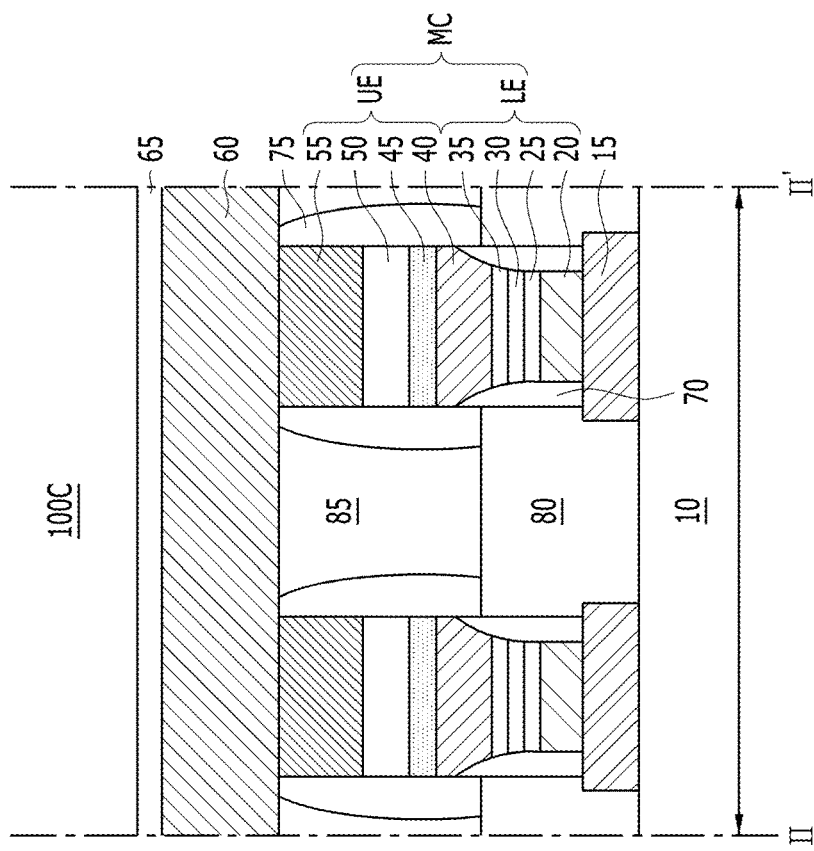
Figure 5B:
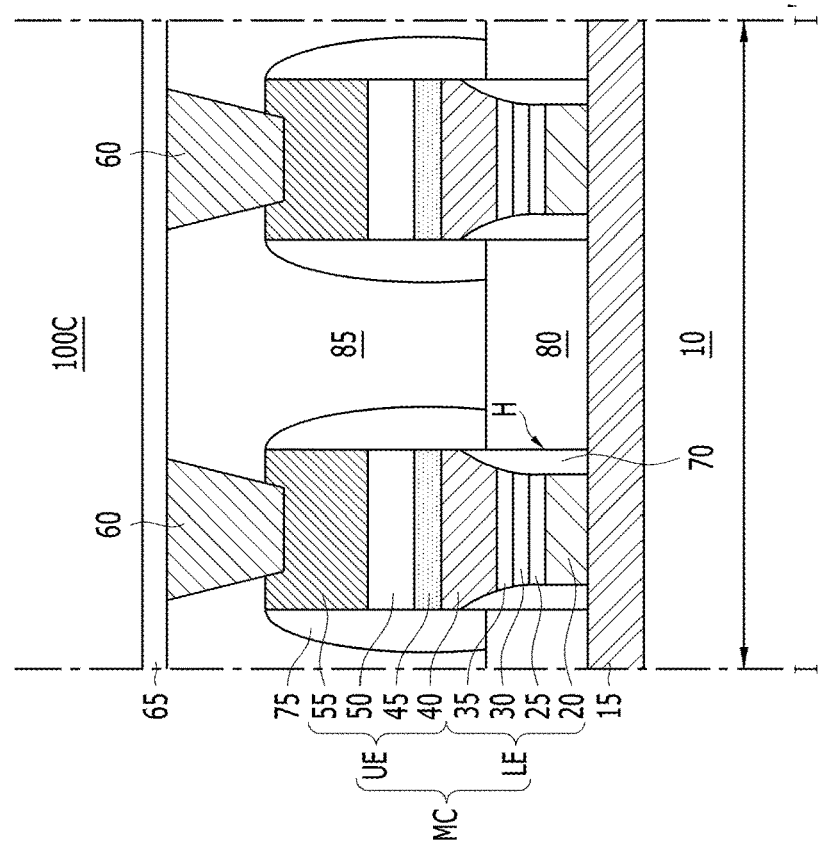

Referring to FIGS. 5A and 5B, a semiconductor memory device 100C in accordance with an embodiment of the present disclosure may include a memory cell stack MC having a lower element LE that includes a self-compliance unit pattern 25, a buffer electrode pattern 30, and a selection element pattern 35. Unlike the components of the memory cell stack MC shown in FIGS. 3A and 3B, the self-compliance unit pattern 25, the buffer electrode pattern 30, and the selection element pattern 35 have flat top surfaces and/or flat bottom surfaces. That is, the lower element LE of the semiconductor memory device 100C may have a mesa shape or a via plug shape.

In an embodiment, the lower element LE and a lower spacer 70 of the memory cell stack MC may each have a flat top surface.

With further reference to FIGS. 3A and 3B, components of the lower element LE of the memory cell stack MC, for example, the lower electrode 20, the self-compliance unit pattern 25, the buffer electrode pattern 30, and the selection element pattern 35, may each have one of a bowl shape and a mesa shape.

Figure 6A:
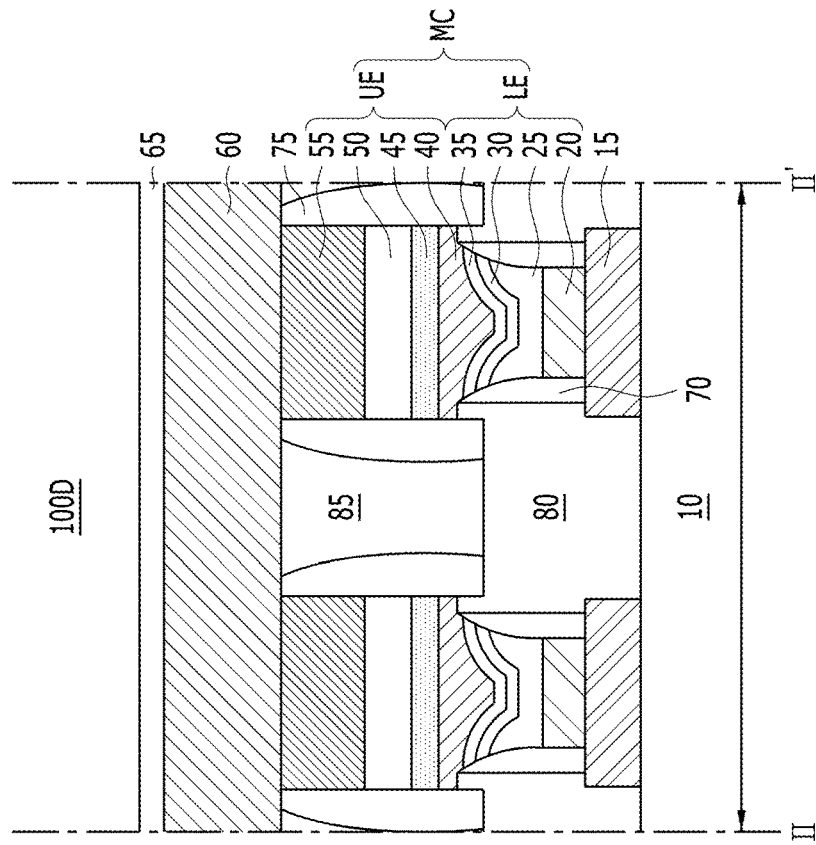
Figure 6B:
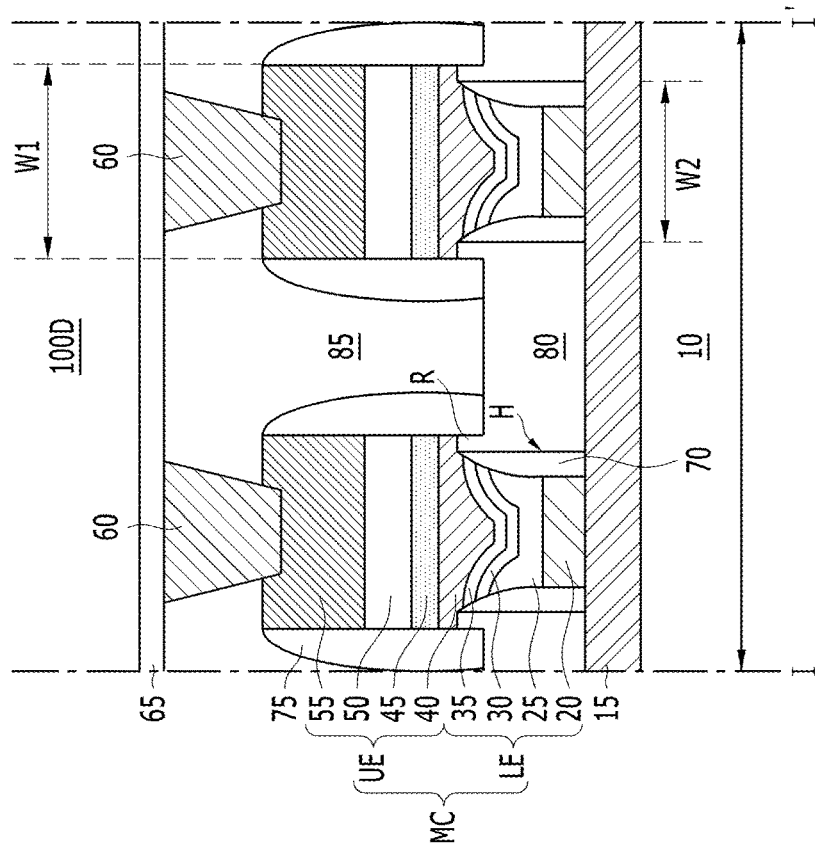

Referring to FIGS. 6A and 6B, a semiconductor memory device 100D in accordance with an embodiment of the present disclosure may include a memory cell stack MC having an upper element UE, which includes an upper electrode 55, a reservoir pattern 50, a memory pattern 45, and an intermediate electrode pattern 40. Unlike the upper element UE shown in FIGS. 3A and 3B, the upper element UE of the semiconductor memory device 100D has a horizontal width W1 that is greater than a horizontal width W2 of a hole H. The horizontal width W1 may also be described as a diameter of the upper element UE, and the horizontal width W2 may also be described as a diameter of the hole H. In other words, an inner width W1 of the upper spacer 75 (or distance or diameter between inner walls of the upper spacer 75) of the memory cell stack MC may be greater than an outer width W2 of a lower spacer 70 (or distance or diameter between outer walls of the lower spacer 70). For example, a lower interlayer insulating layer 80 may have a rim portion R, which protrudes upward between the lower spacer 70 and the upper spacer 75. The rim portion R may have a disk shape, a rectangular shape, a ring shape, or a combination thereof, in a top view. For example, the rim portion R may have a cross-section that has the shape of a disk, a rectangle, a ring, or a combination thereof. A top end of the lower spacer 70 may protrude upward, and may extend to a higher level than a bottom surface of the upper spacer 75. An upper surface of the protruding top end of the lower spacer 70 and an upper surface of the rim portion R of the lower interlayer insulating layer 80 may be at substantially the same vertical level. Upper portions of the lower spacer 70 and lower portions of the upper spacer 75 may be horizontally spaced apart from each other by the rim portion R. That is, the upper portions of the lower spacer 70 and the lower portions of the upper spacer 75 may be spaced apart from each other in a radial direction, with respect to the memory cell stack MC.

The technical features shown in FIGS. 3A and 3B to 6A and 6B and described above may be compatibly applied with each other. For example, features of different embodiments shown in FIGS. 3A and 3B to 6A and 6B can be combined with each other in other embodiments.

FIGS. 7A and 7B to FIGS. 21A and 21B are schematic illustrations of the semiconductor memory device 100A of FIGS. 3A and 3B that is fabricated by a method in accordance with an embodiment of the present disclosure. FIGS. 7A, 8A, 9A, 10A, 11A, 12A, 13A, 14A, 15A, 16A, 17A, 18A, 19A, 20A, and 21A are longitudinal cross-sectional views of the semiconductor memory device 100A taken along the line I-I' of FIG. 2. FIGS. 7B, 8B, 9B, 10B, 11B, 12B, 13B, 14B, 15B, 16B, 17B, 18B, 19B, 20B, and 21B are longitudinal cross-sectional views of the semiconductor memory device 100A taken along the line II-II' of FIG. 2.

Referring to FIGS. 7A and 7B, the method of manufacturing the semiconductor memory device 100A in accordance with an embodiment of the present disclosure may include forming lower conductive interconnections 15 on a lower layer 10, forming a lower interlayer insulating layer 80 covering the lower conductive interconnections 15, and forming holes H vertically penetrating the lower interlayer insulating layer 80 to expose portions of upper surfaces of the lower conductive interconnections 15.

The lower layer 10 may be a substrate, a base insulating layer, or both. For example, when the lower layer 10 is a substrate, the lower conductive interconnections 15 may be embedded in the lower layer 10. When the lower layer 10 is a base insulating layer, the lower conductive interconnections 15 may be embedded in the lower layer 10 or may be disposed on the lower layer 10.

Forming the lower conductive interconnections 15 may include forming a conductive layer on the lower layer 10 by performing a deposition process, patterning the conductive layer by performing a photolithography process, and performing an etch process. Alternatively, in another embodiment of the present disclosure, forming the lower conductive interconnections 15 may include forming trenches in the lower layer 10, filling the trenches with a conductive material, and performing a CMP (chemical mechanical polishing) process to planarize the conductive material. The lower conductive interconnections 15 may include a metal, such as tungsten (W), aluminum (Al) or copper (Cu); a metal compound, such as titanium nitride (TiN), tantalum nitride (TaN), or tungsten nitride (WN); a conductive material, such as a metal silicide; a metal alloy; or a combination thereof.

Forming the lower interlayer insulating layer 80 may include forming an insulating material layer, which covers the lower conductive interconnections 15, by performing a deposition process or a coating process. The lower interlayer insulating layer 80 may include silicon oxide, and may further include carbon (C) and/or hydrogen (H).

Forming the holes H may include forming a mask pattern on the lower interlayer insulating layer 80 and performing an etching process, using the mask pattern as an etching mask.

Referring to FIGS. 8A and 8B, the method may include forming lower spacers 70 in the holes H. Forming the lower spacers 70 may include forming an insulating material layer that fills the holes H by performing a deposition process and performing an etch-back process. The lower spacers 70 may have a hollow cylindrical shape. For example, the lower spacers 70 may have a ring shape that exposes the upper surface of the lower conductive interconnections 15 in a top view. In an embodiment, each of the lower spacers 70 has a cross-section that is in the shape of a ring.

Referring to FIGS. 9A and 9B, the method may include forming the lower electrodes 20 in the holes H. Forming the lower electrodes 20 may include filling the holes H with a lower electrode material layer by performing a deposition process, and recessing the lower electrode material layer by performing an etch-back process. For example, upper surfaces of the lower electrodes 20 may be located at a middle level of the holes H, i.e., at a level between a level of the bottom of the holes H and a level of the top of the holes H. The lower electrode material layer and the lower electrodes 20 may include a metal, such as tungsten (W), aluminum (Al), or copper (Cu); a metal compound, such as titanium nitride (TiN), tantalum nitride (TaN), or tungsten nitride (WN); a conductive material, such as a metal silicide or a metal alloy; or a combination thereof.

Figure 10A:
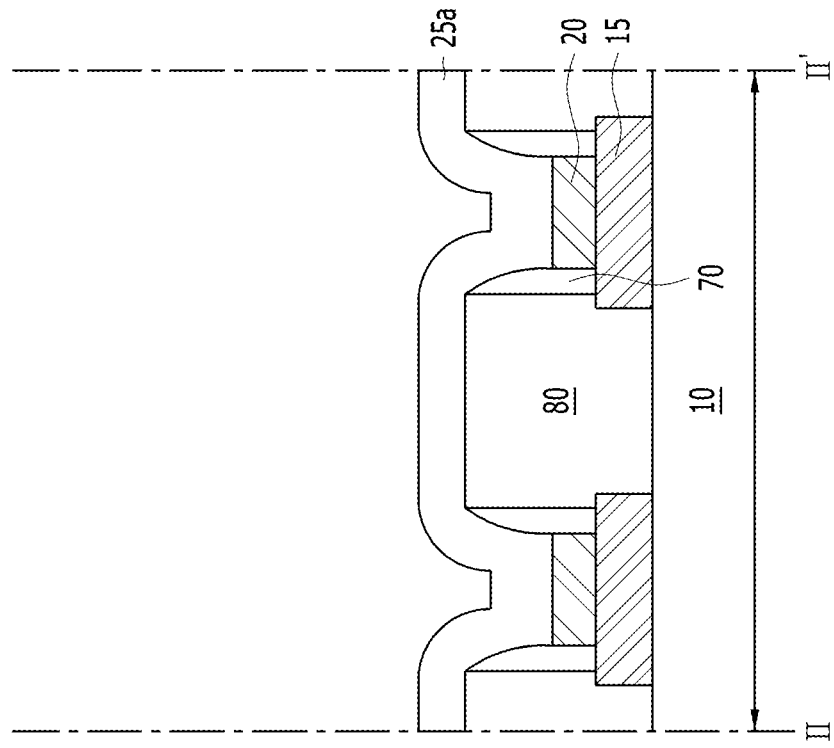
Figure 10B:
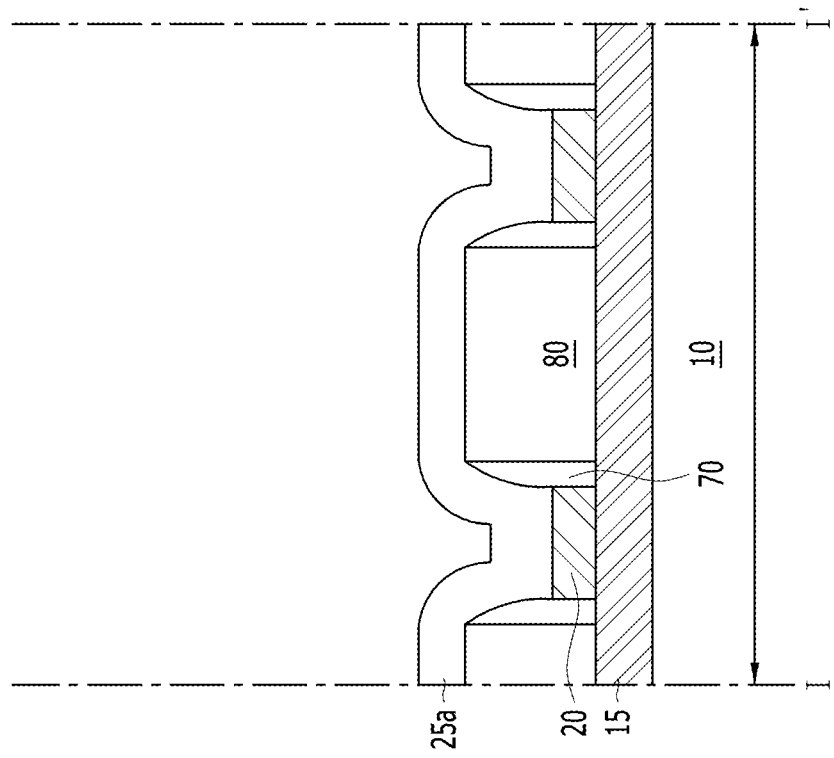

Referring to FIGS. 10A and 10B, the method may include conformably forming a self-compliance unit material layer 25a on the lower electrodes 20, the lower spacers 70, and the lower interlayer insulating layer 80. A portion of the self-compliance unit material layer 25a is formed in the holes H. The self-compliance unit material layer 25a may include a hafnium-based material, such as hafnium oxide ($HfO_x$).

Figure 11A:
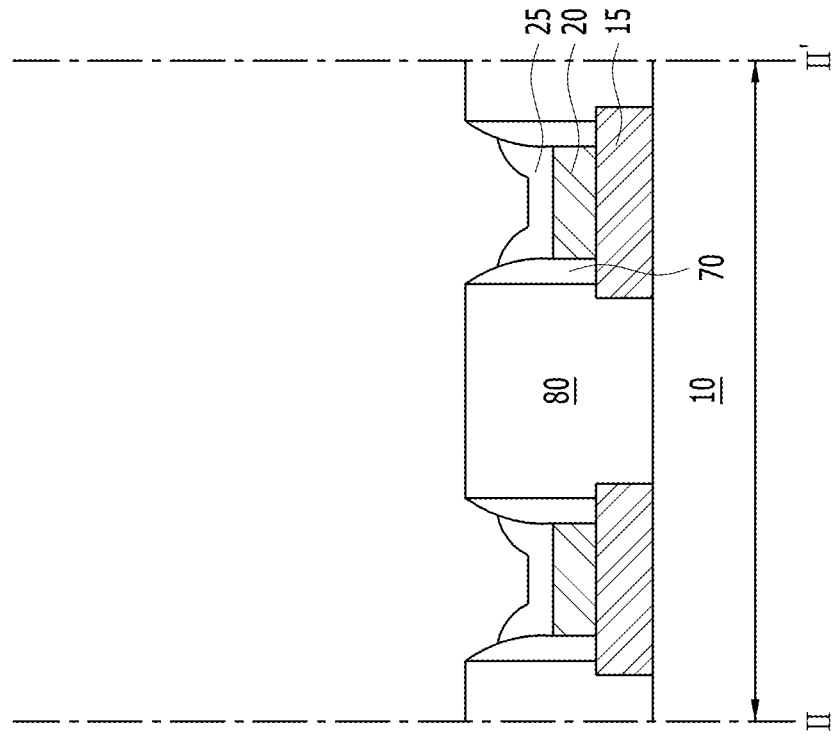
Figure 11B:
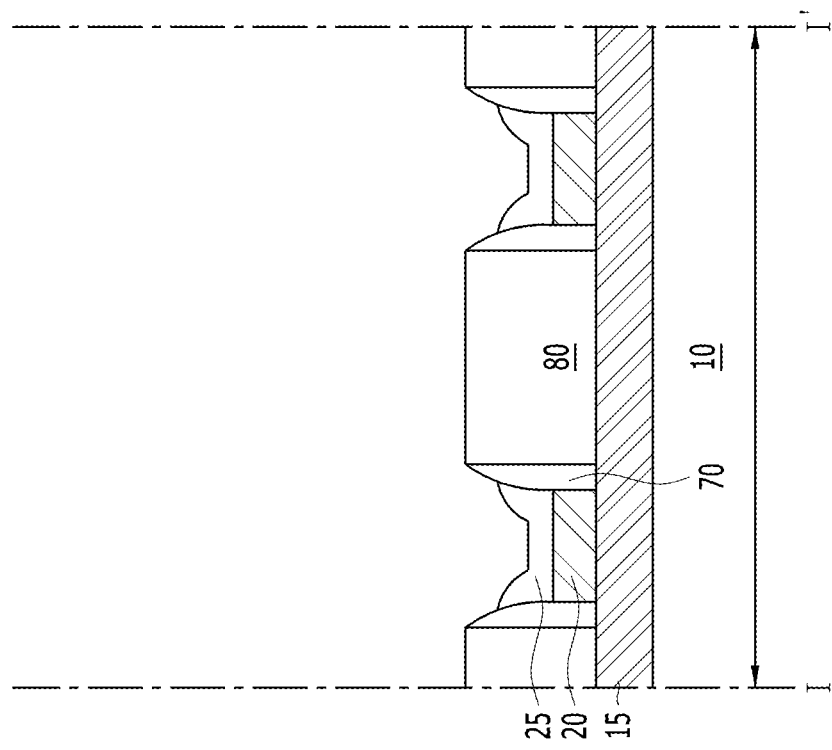

Referring to FIGS. 11A and 11B, the method may include forming self-compliance unit patterns 25 on the lower electrodes 20 and the lower spacers 70, and in the holes H. Forming the self-compliance unit patterns 25 may include performing an etch-back process. The self-compliance unit patterns 25 may have a bowl shape. Top ends of the self-compliance unit patterns 25 may be disposed in the holes H. That is, portions of the holes H may be filled with the lower electrodes 20 and the self-compliance unit patterns 25. During the etch-back process, the self-compliance unit patterns 25 may be minimally exposed to an etching gas. Therefore, degradation of the electrical and physical properties of the self-compliance unit patterns 25 can be minimized.

Figure 12A:
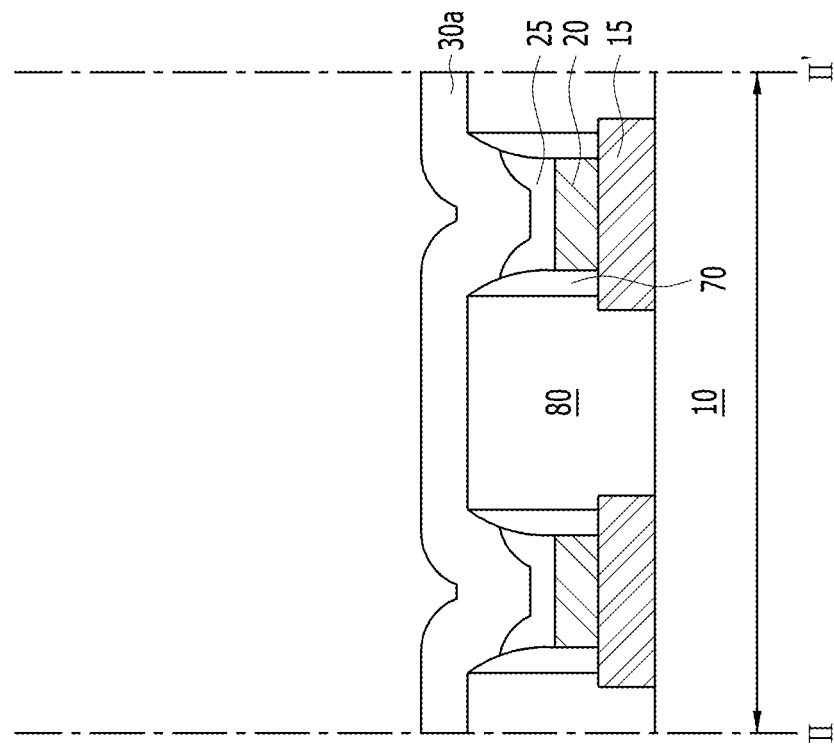
Figure 12B:
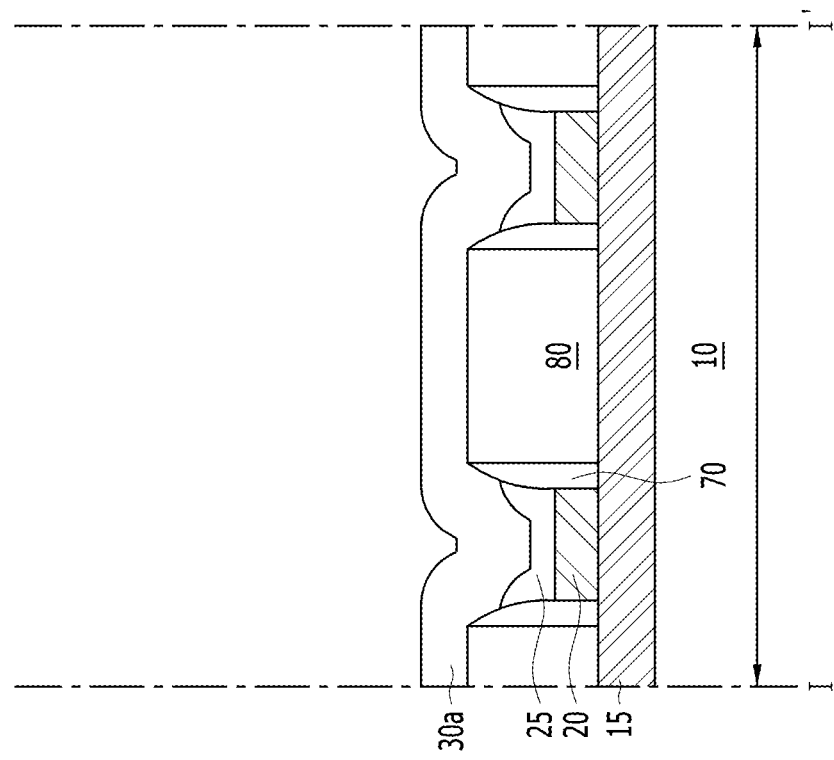

Referring to FIGS. 12A and 12B, the method may include conformably forming a buffer electrode material layer 30a on the self-compliance unit patterns 25 in the holes H and the lower interlayer insulating layer 80 by performing a deposition process. The buffer electrode material layer 30a may include a metal, such as tungsten (W), aluminum (Al), or copper (Cu); a metal compound, such as titanium nitride (TiN), tantalum nitride (TaN), or tungsten nitride (WN); a conductive material, such as a metal silicide or a metal alloy; or a combination thereof.

Referring to FIGS. 13A and 13B, the method may include forming buffer electrode patterns 30 on the self-compliance unit patterns 25 by performing an etch-back process. The buffer electrode patterns 30 may have a bowl shape, and may be disposed in the holes H. Top ends of the buffer electrode patterns 30 may be disposed in the holes H. During the etch-back process, the buffer electrode patterns 30 may be minimally exposed to an etching gas. Therefore, degradation of the electrical and physical characteristics of the buffer electrode patterns 30 can be minimized.

Referring to FIGS. 14A and 14B, the method may include conformably forming a selection element material layer 35a on the buffer electrode patterns 30 and the lower interlayer insulating layer 80 by performing a deposition process. The selection element material layer 35a may include ion doped silicon, ion doped oxide, ion doped nitride, or a combination thereof. For example, the ions may include boron (B), carbon (C), nitrogen (N), arsenic (As), phosphorous (P), silicon (Si), germanium (Ge), gallium (Ga), another ion-implantable material, or a combination thereof. The oxide may include silicon oxide ($SiO_2$), aluminum oxide ($Al_2O_3$), zirconium oxide ($ZrO_2$), titanium oxide ($TiO_2$), another oxide material, or a combination thereof.

Referring to FIGS. 15A and 15B, the method may include forming selection element patterns 35 on the buffer electrode patterns 30 by performing an etch-back process. Forming the selection element patterns 35 may include performing an etch-back process. The selection element patterns 35 may also have a bowl shape. Top ends of the selection element patterns 35 may be located at the same level as, or a lower level than, the top of the holes H and/or top ends of the lower spacers 70. For example, top ends of the selection element patterns 35 may be disposed in the holes H. During the etch-back process, the selection element patterns 35 may be minimally exposed to an etching gas. Therefore, degradation of the io electrical and physical properties of the selection element patterns 35 can be minimized. Accordingly, a lower element LE including the lower electrode 20, the self-compliance unit pattern 25, the buffer electrode pattern 30, and the selection element pattern 35 may be formed. The lower element LE may be confined to the hole H by the lower spacer 70.

Figure 16A:
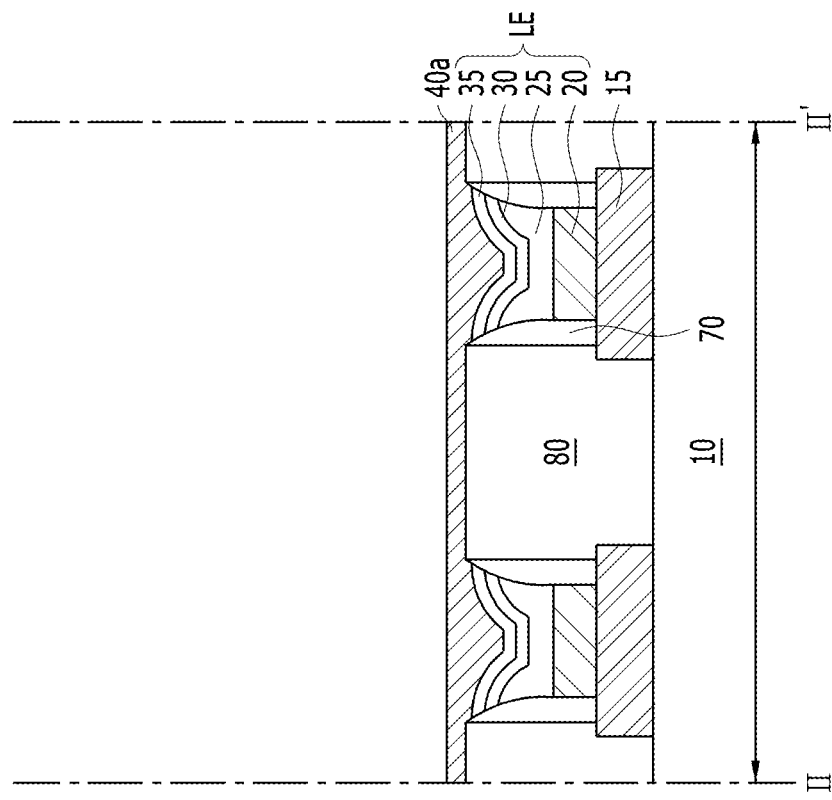
Figure 16B:
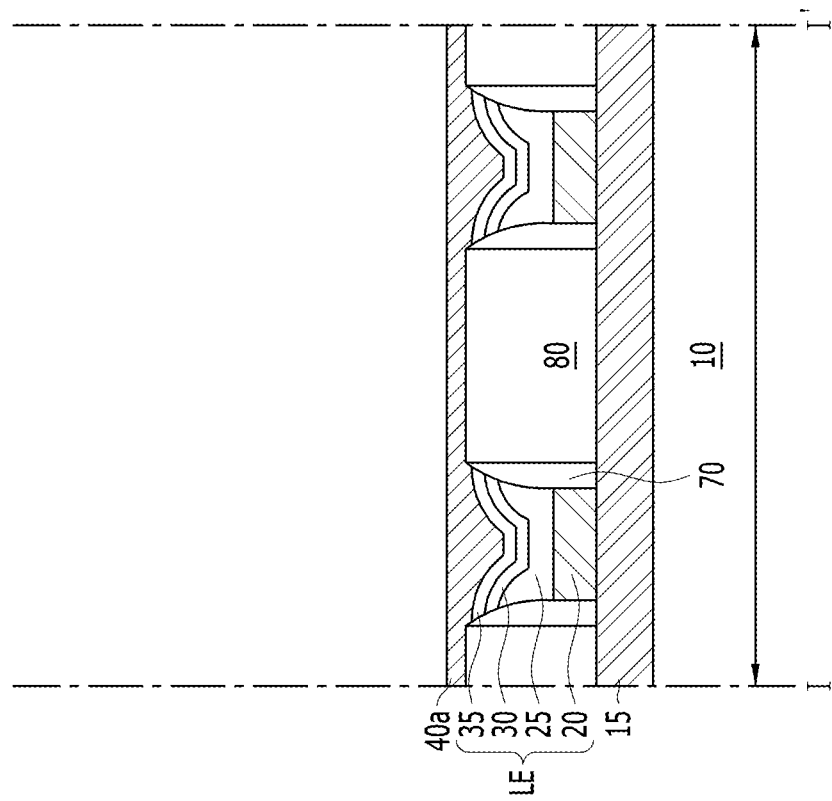

Referring to FIGS. 16A and 16B, the method may include forming an intermediate electrode material layer 40a on the select element patterns 35 and the lower interlayer dielectric layer 80 by performing a deposition process. After depositing the intermediate electrode material layer 40a, the method may further include performing a CMP process on the intermediate electrode material layer 40a. The intermediate electrode material layer 40a may include a metal, such as tungsten (W), aluminum (Al), or copper (Cu); a metal compound, such as titanium nitride (TiN), tantalum nitride (TaN), or tungsten nitride (WN); a conductive material, such as a metal silicide; a metal alloy; or a combination thereof.

Referring to FIGS. 17A and 17B, the method may include sequentially forming a memory material layer 45a, a reservoir material layer 50a, and an upper electrode material layer 55a on the intermediate electrode material layer 40a by performing a deposition process and forming mask patterns M on the upper electrode material layer 55a.

The memory material layer 45a may include a variable resistive material. For example, the memory material layer 45a may include a metal oxide, such as hafnium oxide ($HfO_2$), tantalum oxide ($Ta_2O_5$), titanium oxide ($TiO_2$), zirconium oxide (ZrO), or zinc oxide (ZnO); a phase-changeable material, such as a chalcogenide material; a mechanical variable resistance material, such as a conductive bridging material; another memristor material; or a combination thereof. The memory material layer 45a may include a metal oxide, such as hafnium oxide ($HfO_2$).

The reservoir material layer 50a may include a material capable of providing oxygen atoms or oxygen ions, storing oxygen atoms or oxygen ions, or both. For example, the reservoir material layer 50a may include a metal, such as tantalum (Ta) or titanium (Ti).

The upper electrode material layer 55a may include a metal, such as tungsten (W), aluminum (Al), or copper (Cu); a metal compound, such as titanium nitride (TiN), tantalum nitride (TaN), or tungsten nitride (WN); a conductive material, such as a metal silicide; a metal alloy; or a combination thereof.

The mask patterns M may include photoresist patterns or hard mask patterns. The hard mask patterns may include silicon nitride, silicon oxynitride, silicon containing carbon, another inorganic material, or a combination thereof. The mask patterns M may vertically overlap the holes H.

Referring to FIGS. 18A and 18B, the method may include forming upper electrodes 55, reservoir patterns 50, memory patterns 45, and intermediate electrodes 40 by patterning the upper electrode material layer 55a, the reservoir material layer 50a, the memory material layer 45a, and the intermediate electrode material layer 40a, respectively, using the mask pattern M as an etch mask.

Upper surfaces of the lower interlayer insulating layer 80 may be recessed, such that outer surfaces of the top ends of the lower spacers 70 may be exposed. The mask pattern M may be removed. In FIGS. 18A and 18B, side surfaces of the intermediate electrode 40, side surfaces of the memory pattern 45, side surfaces of the reservoir pattern 50, side surfaces of the upper electrode 55, inner walls of the holes H, and outer sidewalls of the lower spacers 70 are shown as being vertically aligned, but other configurations are possible.

During the method, an upper element UE including the intermediate electrode 40, the memory pattern 45, the reservoir pattern 50, and the upper electrode 55 may be formed. According to various embodiments, a plurality of memory cell stacks MC respectively including a plurality of lower elements LE and a plurality of upper elements UE can be formed.

The lower elements LE may include the lower electrodes 20, the self-compliance unit patterns 25, the buffer electrode patterns 30, and the selection element patterns 35. The upper elements UE may include the intermediate electrodes 40, the memory patterns 45, the reservoir patterns 50, and the upper electrodes 55.

In various embodiments, an etching gas having strong reactivity such as chlorine ions (Cl—) can be used to generate components of the lower element LE, the upper element UE, or both. The etching gas having the strong reactivity may adversely affect the selection element pattern 35. For example, the chlorine ions (Cl—) can penetrate to the selection element pattern 35 or can combine with the selection element pattern 35. As a result, the electrical characteristics of the selection element pattern 35 can be deteriorated.

In an embodiment, with further reference to FIGS. 6A and 6B, the horizontal width W1 of the upper element UE may be greater than the horizontal width W2 of the hole H. In this embodiment of the present disclosure, the selection element pattern 35 is not exposed to the etching gas. Therefore, according to the embodiment of the present disclosure, the selection element pattern 35 can have excellent electrical characteristics.

In the etching process, a halogen-based gas, e.g., $Cl_2$, may be used. Specifically, the halogen-based gas, e.g., $Cl_2$, may degrade the electrical and physical properties of the selection element pattern 35. During the etching process for patterning the upper electrode 55, the reservoir pattern 50, the memory pattern 45, and the intermediate electrode 40, the selection element pattern 35 is not exposed to the etching gas, in order to prevent degradation of the electrical and physical characteristics of the selection element pattern 35.

According to an embodiment of the present disclosure, the selection element pattern 35 may be not exposed to the etch gas in an etching process for patterning any of the upper electrode 55, the reservoir pattern 50, the memory pattern 45, and the intermediate electrode 40. That is, the selection element pattern 35 is not attacked by the etching gas. Thus, the selection element patterns 35 can be formed with excellent electrical and physical properties.

Referring to FIGS. 19A and 19B, the method may include forming upper spacers 75 on sidewalls of the upper elements UE of the memory cell stacks MC. Forming the upper spacers 75 may include covering the memory stacks MC with an insulating material layer by performing a deposition process, and performing an etch-back process on the insulating material layer. The upper spacers 75 may have a cylindrical shape. For example, the upper spacers 75 may have a ring shape surrounding the sidewalls of the upper elements UE of the memory cell stacks MC in a top view. In an embodiment, each of the upper spacers 75 may have a cross-section that has a ring shape. Inner surfaces of the bottom ends of the upper spacer 75 may be in contact with outer surfaces of the top ends of the lower spacers 70. In another embodiment of the present disclosure, with reference to FIGS. 6A and 6B, the upper spacer 75 and the lower space 70 may be horizontally spaced apart from each other by the rim portion R. That is, the lower interlayer insulating layer 80 may be interposed between the inner surfaces of the bottom ends of the upper spacer 75 and the outer surfaces of the top ends of the lower spacers 70.

Figure 20B:
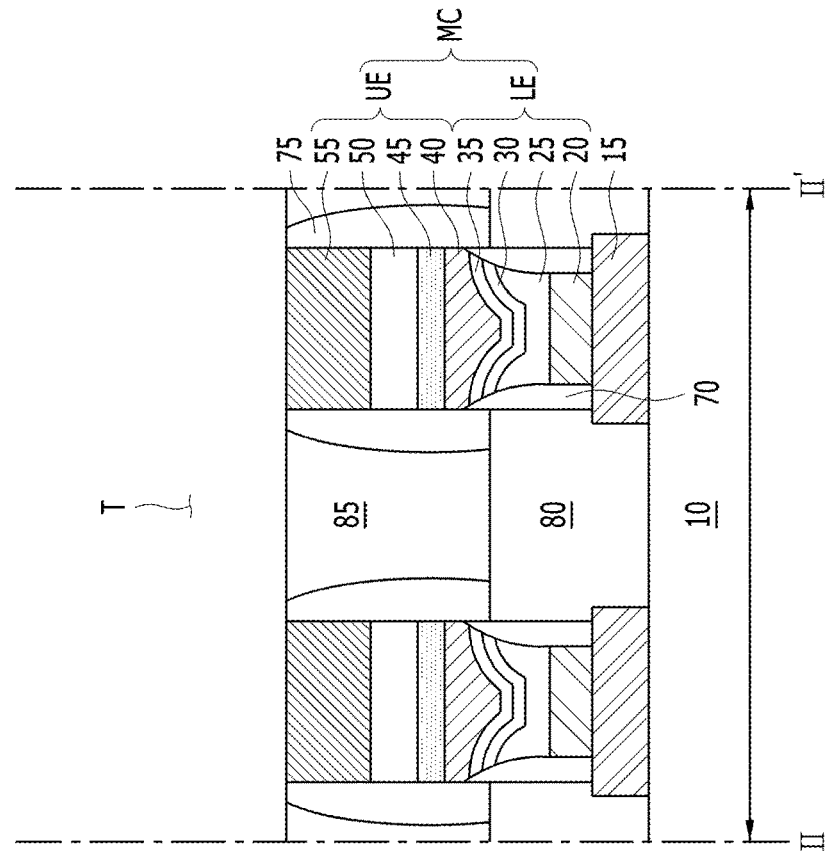
Figure 20A:
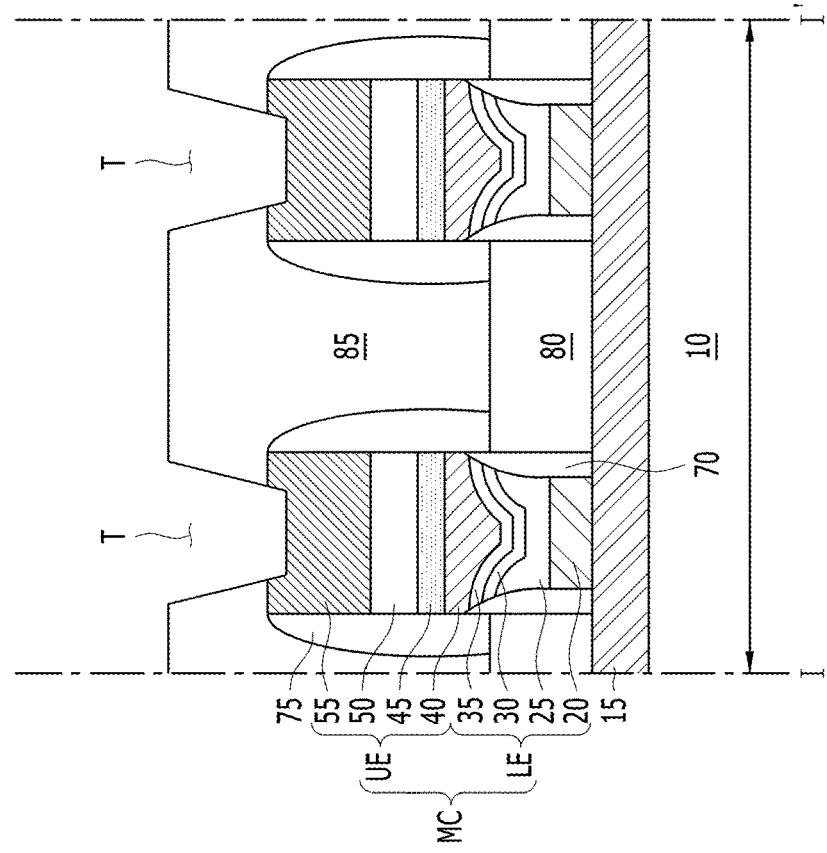

Referring to FIGS. 20A and 20B, the method may include forming an upper interlayer insulating layer 85 and forming trenches T in the upper interlayer insulating layer 85. Forming the upper interlayer insulating layer 85 may include forming an insulating material layer that covers the memory cell stacks MC and the upper spacers 75. For example, the insulating material layer may include silicon oxide. The trenches T may vertically penetrate the upper interlayer insulating layer 85, and may expose portions of the upper electrodes 55 and portions of the upper spacers 75. The trenches T may extend in a horizontal direction that is perpendicular to the lower conductive interconnections 15 and to a vertical direction.

Referring to FIGS. 21A and 21B, the method may include forming upper conductive interconnects 60 by filling the trenches T with a conductive material. The conductive material may include a metal, such as tungsten (W), aluminum (Al) or copper (Cu); a metal compound, such as titanium nitride (TiN), tantalum nitride (TaN), or tungsten nitride (WN); a conductive material, such as a metal silicide or a metal alloy; or a combination thereof. Forming the upper conductive interconnects 60 may include filling the trenches T by performing a deposition process, a plating process, or both, and then performing a CMP process.

Then, referring to FIGS. 3A and 3B, the method may further include forming the capping insulating layer 65 on the upper conductive interconnections 60 and the upper interlayer insulating layer 85. The capping insulating layer 65 may include a material that is denser and harder than the upper interlayer insulating layer 85. For example, the capping dielectric layer 65 may include silicon nitride, silicon oxynitride, or both.

Figure 22A:
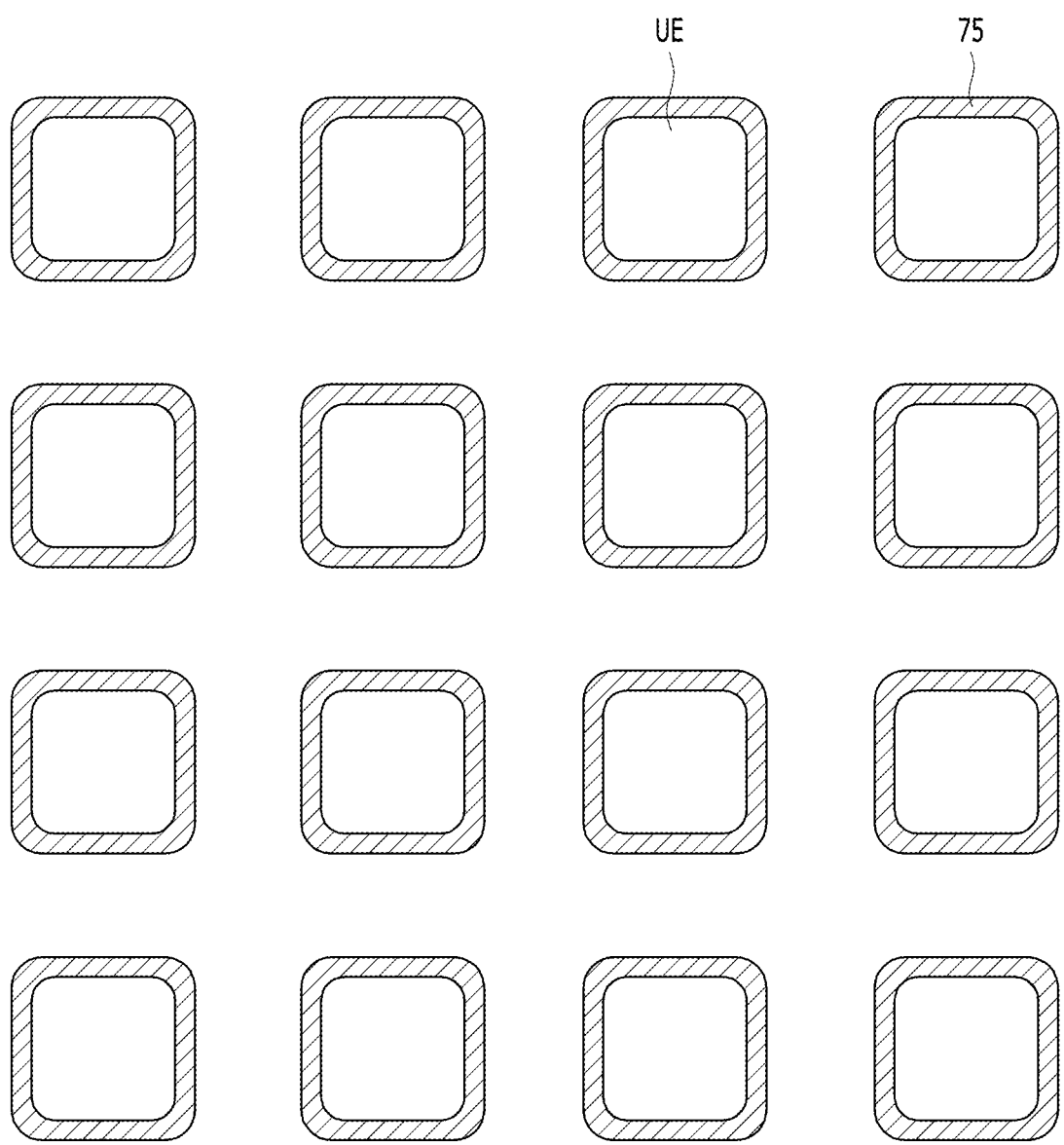
FIGS. 22A and 22B are schematic illustrations of upper elements of memory cell stacks and upper spacers surrounding the upper elements in accordance with various embodiments of the present disclosure.
Figure 22B:
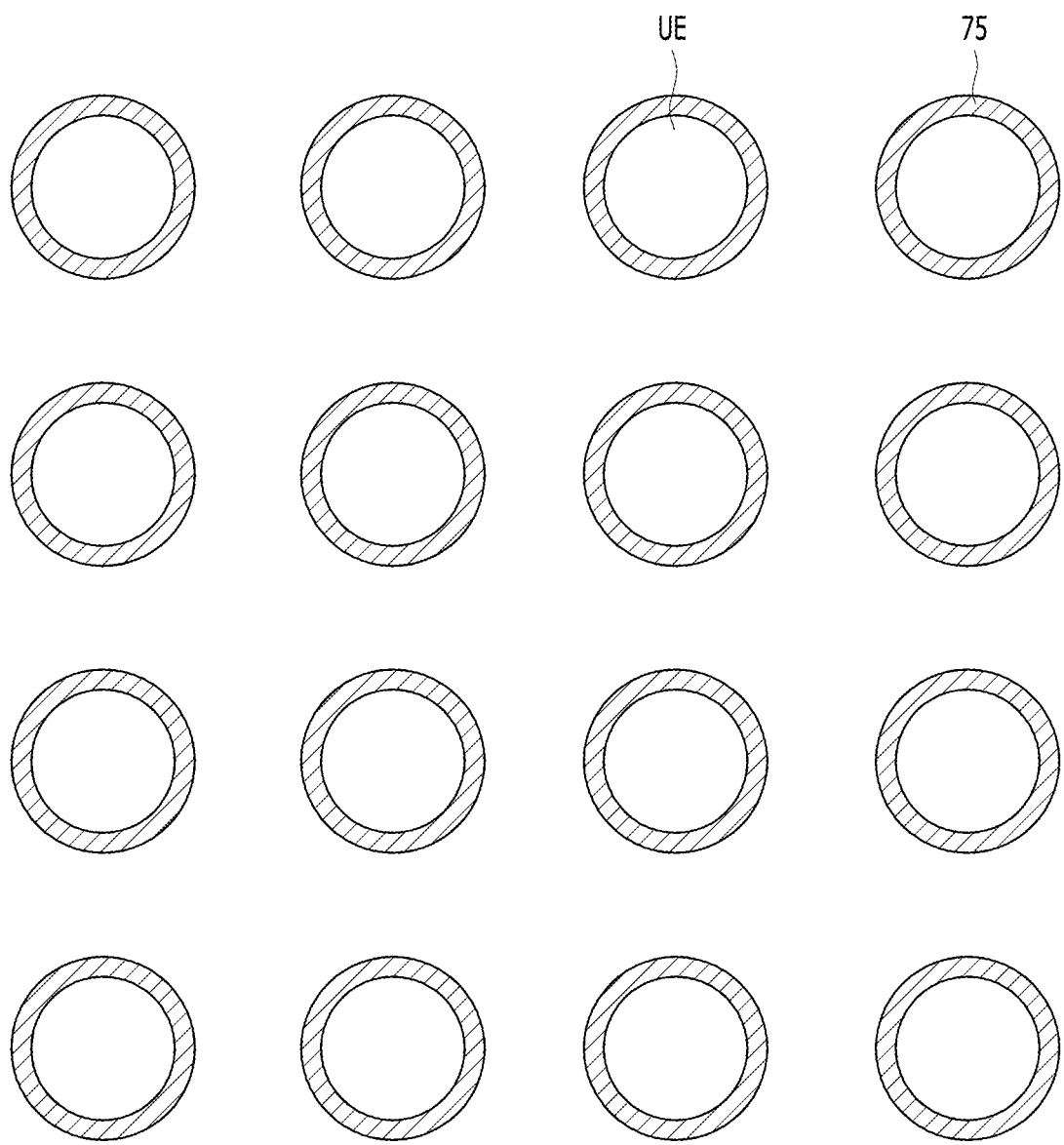

FIGS. 22A and 22B are schematic illustrations of the upper elements UE of the memory cell stacks MC and the upper spacers 75 that surround the upper elements UE in accordance with various embodiments of the present disclosure.

Referring to FIG. 22A, in a top view, the outer surfaces of the upper elements UE of the memory cell stacks MC and the upper spacers 75 may each have a rectangular shape with rounded corners. For example, the upper elements UE and the upper spacers 75 may each have a cross-section whose outer edge has a rectangular shape.

Referring to FIG. 22B, in a top view, the outer surfaces of the upper elements UE of the memory cell stacks MC and the upper spacers 75 may each have a circular shape.

Figure 22C:
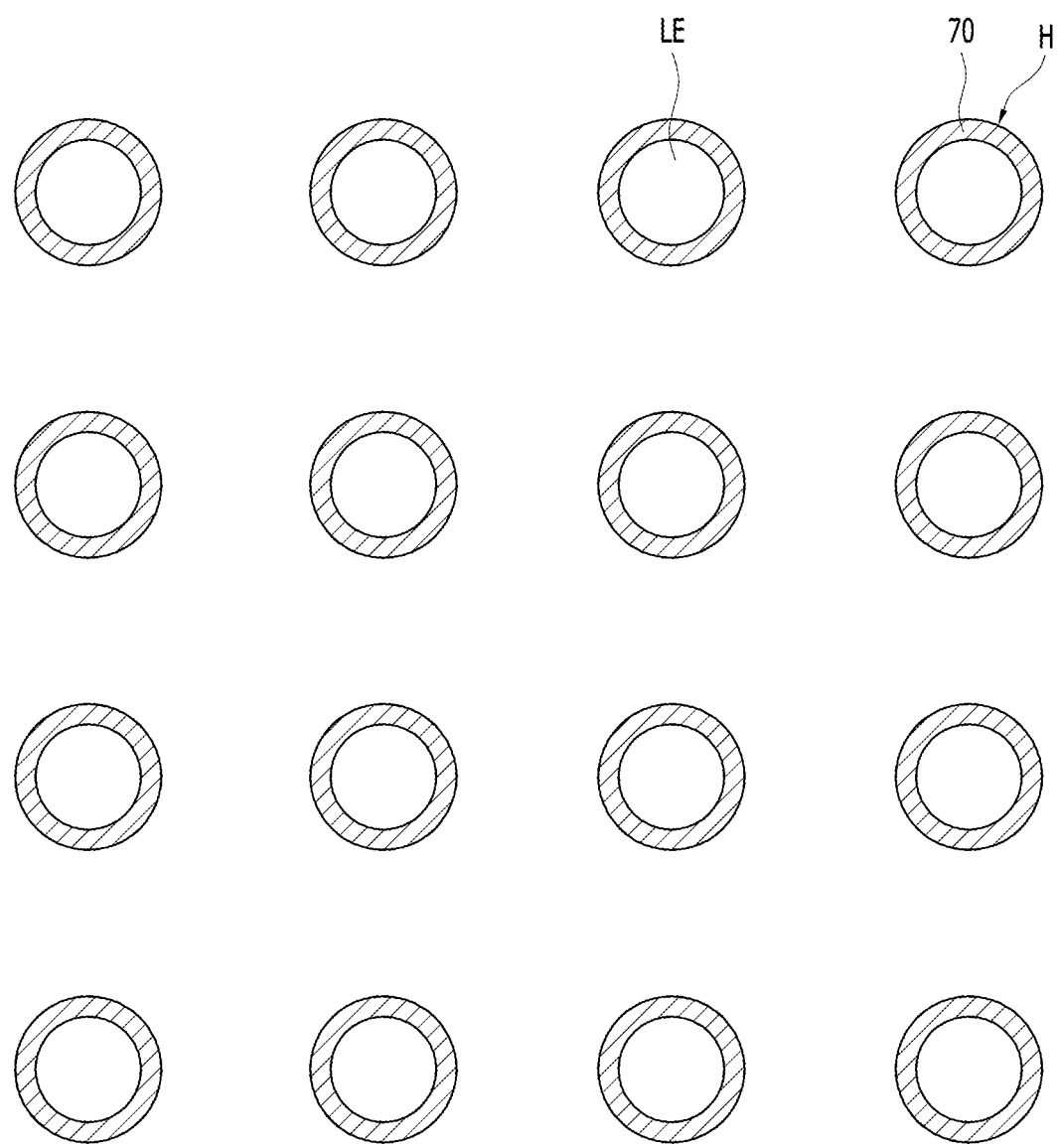
FIG. 22C is a schematic illustration showing a top view of a lower element of a memory cell stack and a lower spacer surrounding the lower element in accordance with an embodiment of the present disclosure.

FIG. 22C is a schematic illustration showing a top view of the lower elements LE of the memory cell stacks MC and the lower spacers 70 surrounding the lower elements LE in accordance with an embodiment of the present disclosure.

Referring to FIG. 22C, in a top view, outer surfaces of the lower elements LE and the lower spacers 70 may each have a circular shape. The outer perimeter of each of the lower spacers 70 may have the same width as each of the holes H. The width of the outer perimeter of each of the lower spacers 70 may also be referred to as a diameter of each of the lower spacers 70.

Figure 23B:
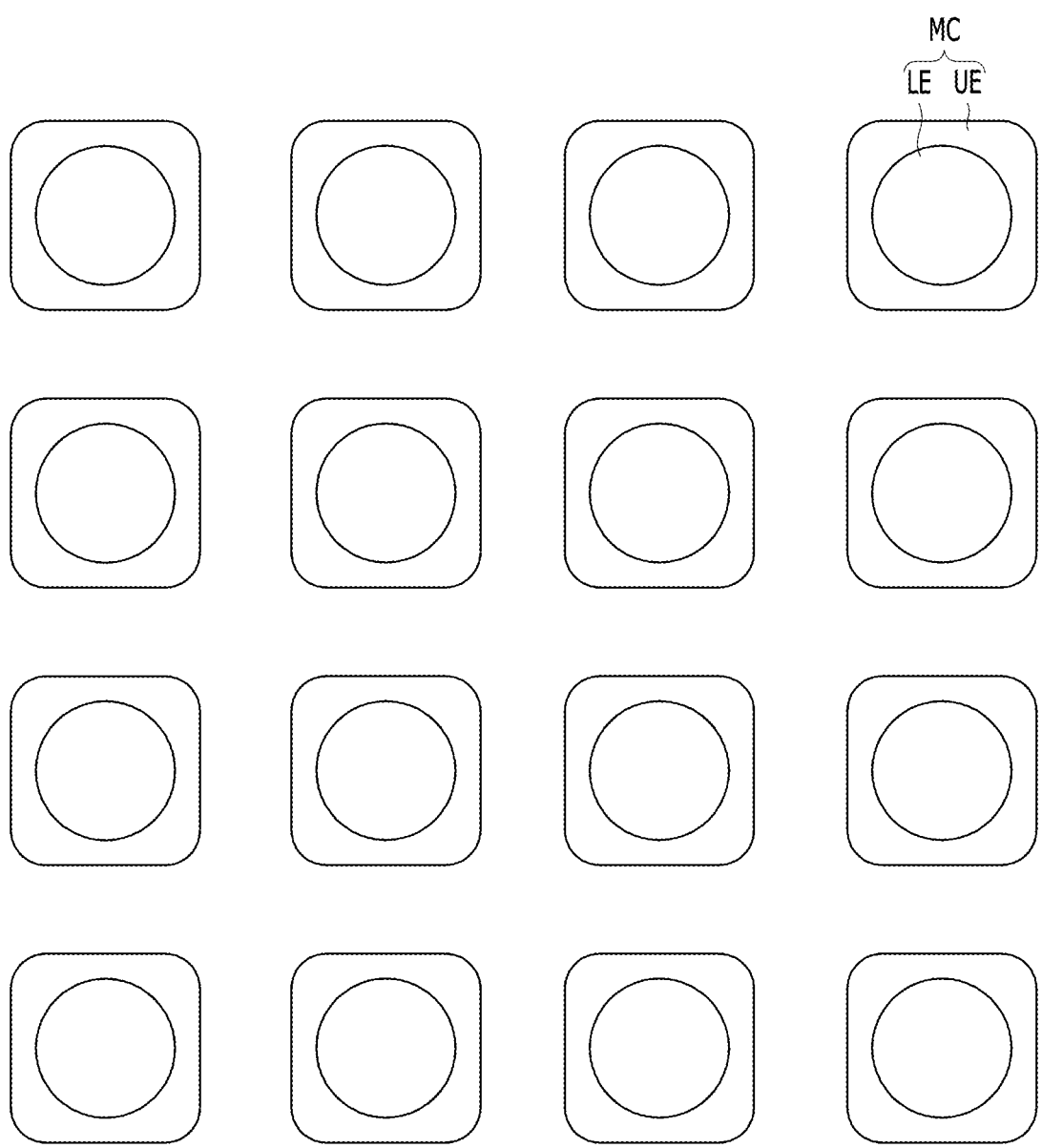
Figure 23C:
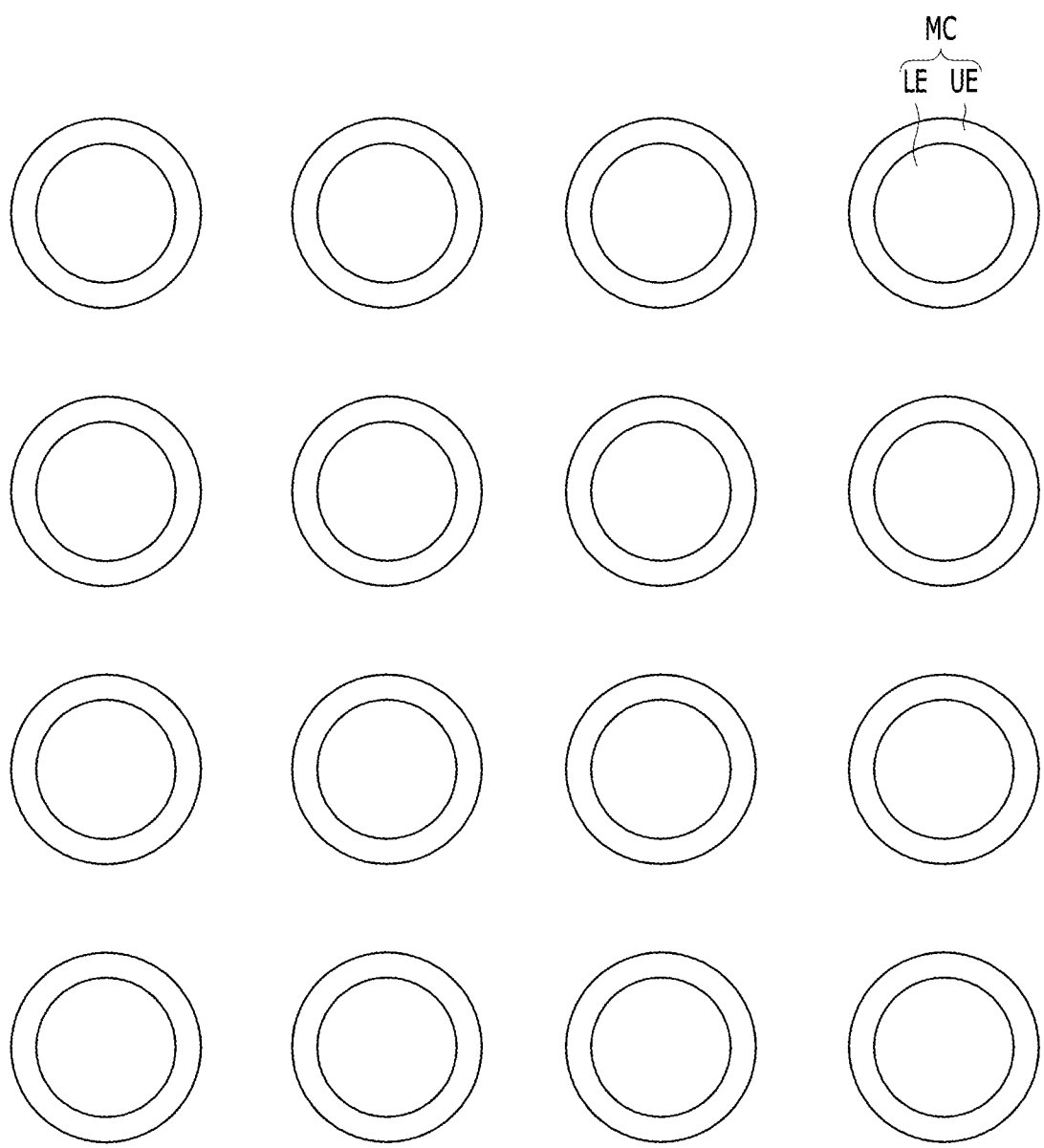

FIGS. 23A to 23C are schematic illustrations showing top views of lower elements LE and upper elements UE of memory cell stacks MC of memory devices 100E-100G in accordance with various embodiments of the present disclosure.

FIG. 23A is a top view of a memory device 100E including a plurality of memory cell stacks MC according to an embodiment of the present disclosure. Each of the memory cell stacks MC includes a lower element LE and an upper element UE. Referring to FIG. 23A, each lower element LE may have a circular shape when viewed from above, and each upper element UE may have a rectangular shape with rounded corners when viewed from above. For example, each lower element LE may have a cross-section with a circular outer perimeter, and each upper element UE may have cross-section with a rectangular outer perimeter having rounded corners.

In addition, the width of each lower element LE in a first direction, and the width of each upper element UE in the first direction, may be the same. The width may also be referred to as a diameter. The first direction is, e.g., the same horizontal or vertical direction. Specifically, the maximum width of each lower element LE and the minimum width of each upper element UE may be the same. The width of each lower element LE in a second direction, for example, a diagonal direction that is oblique with respect to the first direction, may be smaller than the width of each upper element UE in the second direction.

FIG. 23B is a top view of a memory device 100F including a plurality of memory cell stacks MC according to an embodiment of the present disclosure. Each of the memory cell stacks MC includes a lower element LE and an upper element UE. Referring to FIG. 23B, the maximum width of each lower element LE is smaller than the minimum width of each upper element UE.

FIG. 23C is a top view of a memory device 100G including a plurality of memory cell stacks MC according to an embodiment of the present disclosure. Each of the memory cell stacks MC includes a lower element LE and an upper element UE. Referring to FIG. 23C, each lower element LE and each upper element UE may have a circular shape in a top view. That is, each lower element LE and each upper element UE may have a cross section with a circular outer perimeter. For example, each lower element LE and each upper element UE may have concentric shapes. In addition, the diameter of each lower element LE may be smaller than the diameter of each upper element UE.

Referring to FIGS. 23A to 23C, each lower element LE may include the lower electrode 20, the self-compliance unit pattern 25, the buffer electrode pattern 30, the selection element pattern 35, and/or the lower spacer 70. Each upper element UE may include the intermediate electrode 40, the memory pattern 45, the reservoir pattern 50, the upper electrode 55, and/or the upper spacer 75. For example, the width of each lower element LE may be equal to the width of each of the holes H, the width of each of the outer sidewalls, the width of each of the perimeters of the lower spacers 70, or a combination thereof.

The semiconductor memory devices 100A-100G in accordance with the embodiments of the present disclosure may be used in various electronic devices or electronic systems. FIGS. 24 to 28 are electronic devices or electronic systems that include at least one of the semiconductor memory devices 100A-100G in accordance with the embodiments of the present disclosure.

Figure 24:
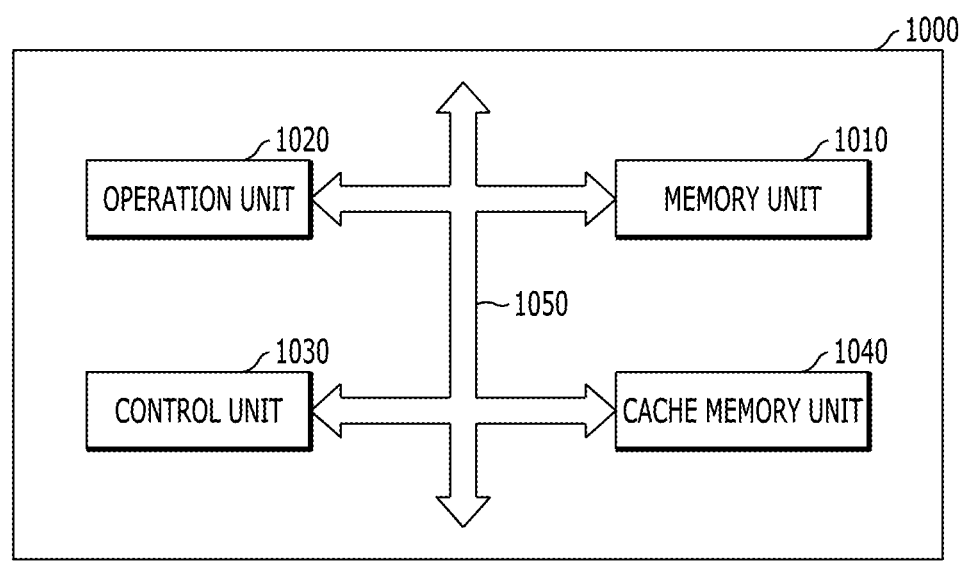
FIG. 24 is a schematic block diagram illustrating a microprocessor that includes one or more semiconductor memory devices in accordance with embodiments of the present disclosure.

FIG. 24 is a schematic block diagram of a microprocessor that includes one or more of the semiconductor memory devices 100A-100G in accordance with the embodiments of the present disclosure. Referring to FIG. 24, a microprocessor 1000 in accordance with an embodiment of the disclosure may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be any of various data processing units such as a central processing unit (CPU), a graphic processing unit (GPU), a digital signal processor (DSP), or an application processor (AP).

The memory unit 1010 is a part which stores data in the microprocessor 1000, such as a processor, a register, or the like. The memory unit 1010 may include a data register, an address register, a floating point register, and so on. Besides, the memory unit 1010 may include various registers. The memory unit 1010 may perform the function of temporarily storing data for operations that are performed by the operation unit 1020, result data of the operations performed by the operation unit 1020, and addresses where data for performing of the operations are stored. The storage unit 1010 may include at least one of the semiconductor memory devices 100A-100G in accordance with the embodiments of the present disclosure.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020, and a device external to the microprocessor 1000; perform extraction, decoding of commands, and controlling input and output of signals of the microprocessor 1000; and execute processing represented by programs.

The microprocessor 1000 in accordance with the embodiment of the present disclosure may further include a cache memory unit 1040, which can temporarily store data to be inputted from an external device other than the memory unit 1010 or to be outputted to an external device. In this case, the cache memory unit 1040 may exchange data with the memory unit 1010, the operation unit 1020, and the control unit 1030 through a bus interface 1050.

Figure 25:
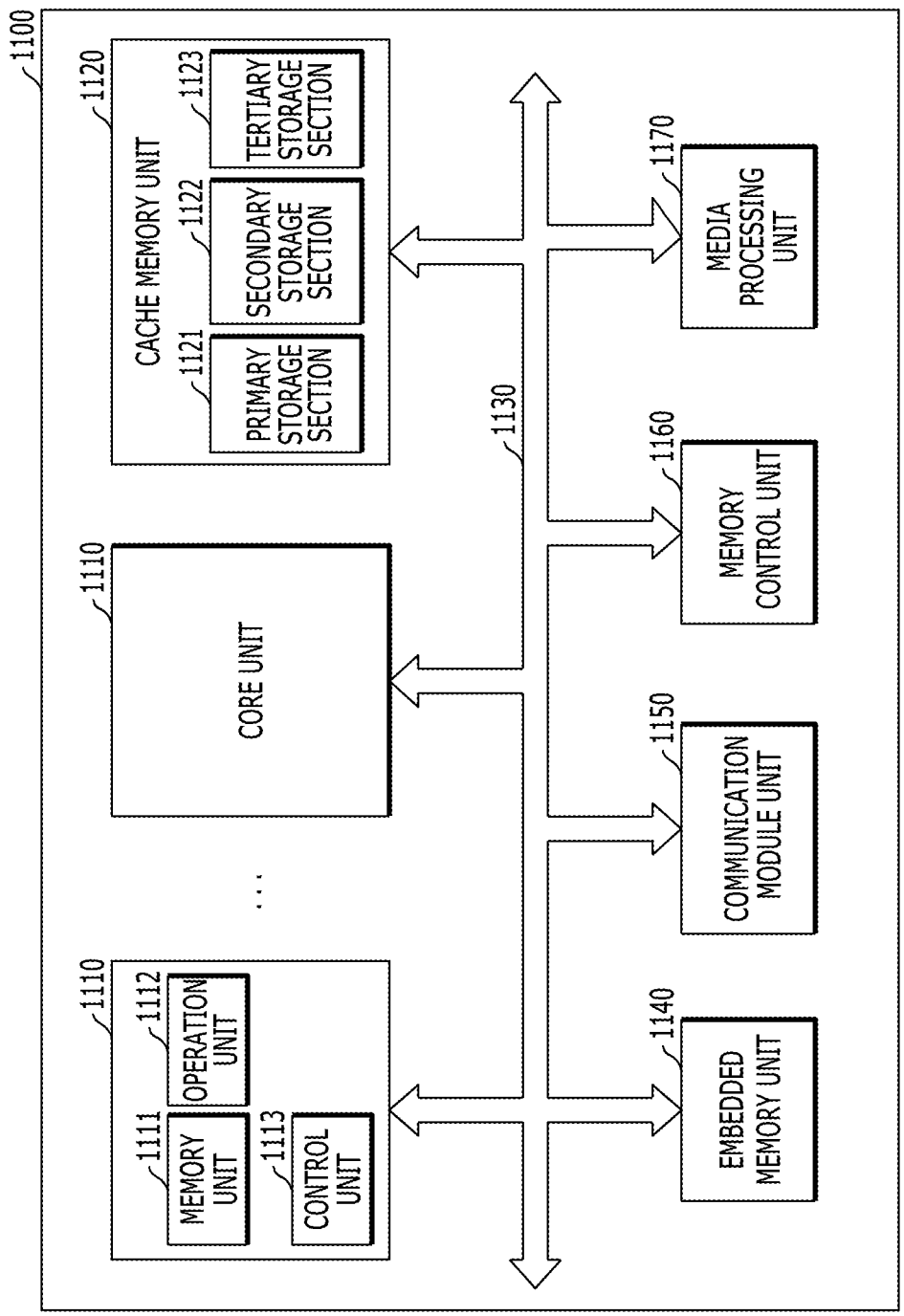
FIG. 25 is a schematic block diagram illustrating a processor that includes one or more semiconductor memory devices in accordance with the embodiments of the present disclosure.

FIG. 25 is a schematic block diagram of a processor that includes one or more of the semiconductor memory devices 100A-100G in accordance with the embodiments of the present disclosure. Referring to FIG. 25, a processor 1100 in accordance with an embodiment of the present disclosure may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which stores data temporarily, and a bus interface 1130 that transfers data between internal and external devices. The processor 1100 may include various system-on-chips (SoCs) such as a multi-core processor, a graphic processing unit (GPU) and an application processor (AP).

The core unit 1110 may be a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of the operations performed by the operation unit 1112, and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on.

The control unit 1113 may receive signals from the memory unit 1111, the operation unit 1112, and a device external to the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122, and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary, and tertiary storage sections 1121, 1122, and 1123 store and discriminate data may be the same or different. In the case where the speeds of the respective storage sections 1121, 1122, and 1123 are different, the speed of the primary storage section 1121 may be largest. At least one storage section of the primary storage section 1121, the secondary storage section 1122, and the tertiary storage section 1123 of the cache memory unit 1120 may include at least one of the semiconductor memory devices 100A-100G in accordance with the embodiments of the present disclosure.

Although it was shown in FIG. 25 that all the primary, secondary and tertiary storage sections 1121, 1122, and 1123 are configured inside the cache memory unit 1120, it is to be noted that all the primary, secondary, and tertiary storage sections 1121, 1122, and 1123 of the cache memory unit 1120 may be configured outside the core unit 1110 and may compensate for a difference in data processing speed between the core unit 1110 and the external device. Alternatively, it is to be noted that the primary storage section 1121 of the cache memory unit 1120 may be disposed inside the core unit 1110, and that the secondary storage section 1122 and the tertiary storage section 1123 may be configured outside the core unit 1110 to strengthen the function of compensating for a difference in data processing speed. In another embodiment of the present disclosure, the primary and secondary storage sections 1121, 1122 may be disposed inside the core units 1110, and tertiary storage sections 1123 may be disposed outside core units 1110.

The bus interface 1130 connects the core unit 1110, the cache memory unit 1120, and an external device to each other, and allows data to be efficiently transmitted.

The processor 1100 in accordance with to the embodiment of the present disclosure may include a plurality of core units 1110, and the plurality of core units 1110 may share the cache memory unit 1120. The plurality of core units 1110 and the cache memory unit 1120 may be directly connected or may be connected through the bus interface 1130. The plurality of core units 1110 may be configured in the same way as the above-described configuration of the core unit 1110. When the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be greater than the processing speeds of the secondary and tertiary storage section 1122 and 1123. In another embodiment of the present disclosure, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 in accordance with the embodiment of the present disclosure may further include an embedded memory unit 1140 that stores data, a communication module unit 1150 that can transmit and receive data to and from an external device in a wired or wireless manner, a memory control unit 1160 that drives an external memory device, and a media processing unit 1170 that processes the data processed in the processor 1100 or the data inputted from an external input device and outputs the processed data to an external interface device, and so on. The processor 1100 may also include a plurality of various other modules and devices. In this case, the plurality of modules may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions. The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory io control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image data, voice data, and others, from the external input device, and may output the data to the external interface device. The media processing unit 1170 may include a graphic processing unit (GPU), a digital signal processor (DSP), a high definition audio device (HD audio), a high definition multimedia interface (HDMI) controller, and so on.

Figure 26:
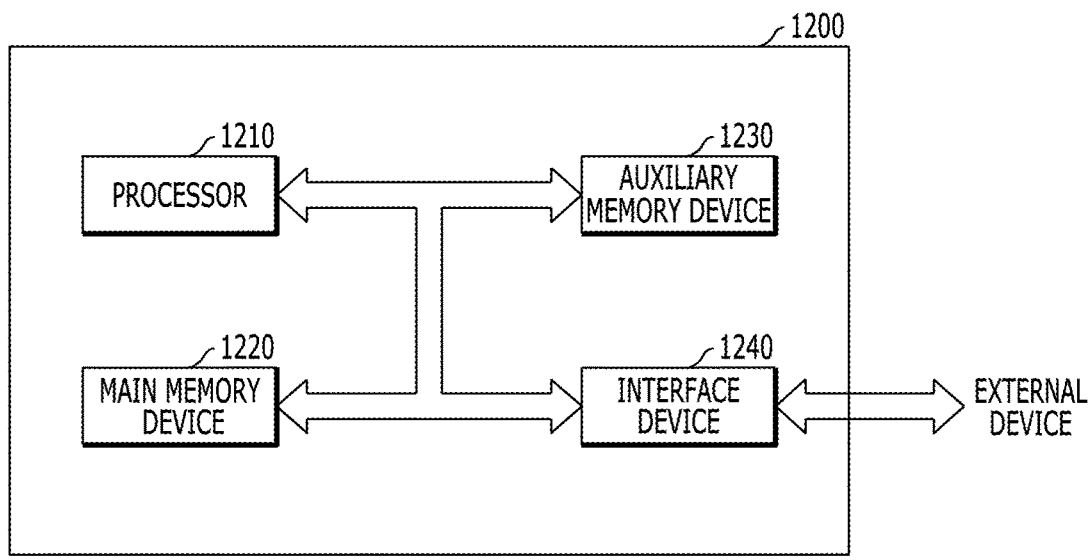
FIG. 26 is a schematic block diagram illustrating an electronic system including one or more semiconductor memory devices in accordance with the embodiments of the present disclosure.

FIG. 26 is a schematic block diagram illustrating an electronic system 1200 that includes one or more of the semiconductor memory devices 100A-100G in accordance with the embodiments of the present disclosure.

Referring to FIG. 26, the electronic system 1200 as an apparatus for processing data may perform input, processing, output, communication, storage, etc., to conduct a series of manipulations for data. The electronic system 1200 may include a processor 1210, a main memory device 1220, an auxiliary memory device 1230, an interface device 1240, and so on. The electronic system 1200 may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call, and execute program codes or data from the auxiliary memory device 1230 when programs are executed, and can conserve memorized contents even when power supply is cut off. The main memory device 1220 may include at least one of the semiconductor memory devices 100A-100G in accordance with the embodiments of the present disclosure. Through this, operating characteristics of the main memory device 1220 may be improved. The main memory device 1220 may further include a static random access memory (SRAM), a dynamic random access memory (DRAM), and so on, of a volatile memory type, in which all contents are erased when power supply is cut off. Alternatively, the main memory device 1220 may not include the semiconductor memory devices 100A-100G in accordance with the embodiments of the present disclosure, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may also include at least one of the semiconductor memory devices 100A-100G in accordance with the embodiments of the present disclosure. Through this, the auxiliary memory device 1230 may be improved. Consequently, operating characteristics of the system 1200 may be improved.

The auxiliary memory device 1230 may further include a data storage system (see the reference numeral 1300 of FIG. 27) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Alternatively, the auxiliary memory device 1230 may not include the semiconductor memory devices 100A-100D in accordance with the embodiment of the present disclosure, but may include data storage systems (see the reference numeral 1300 of FIG. 27) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 27:
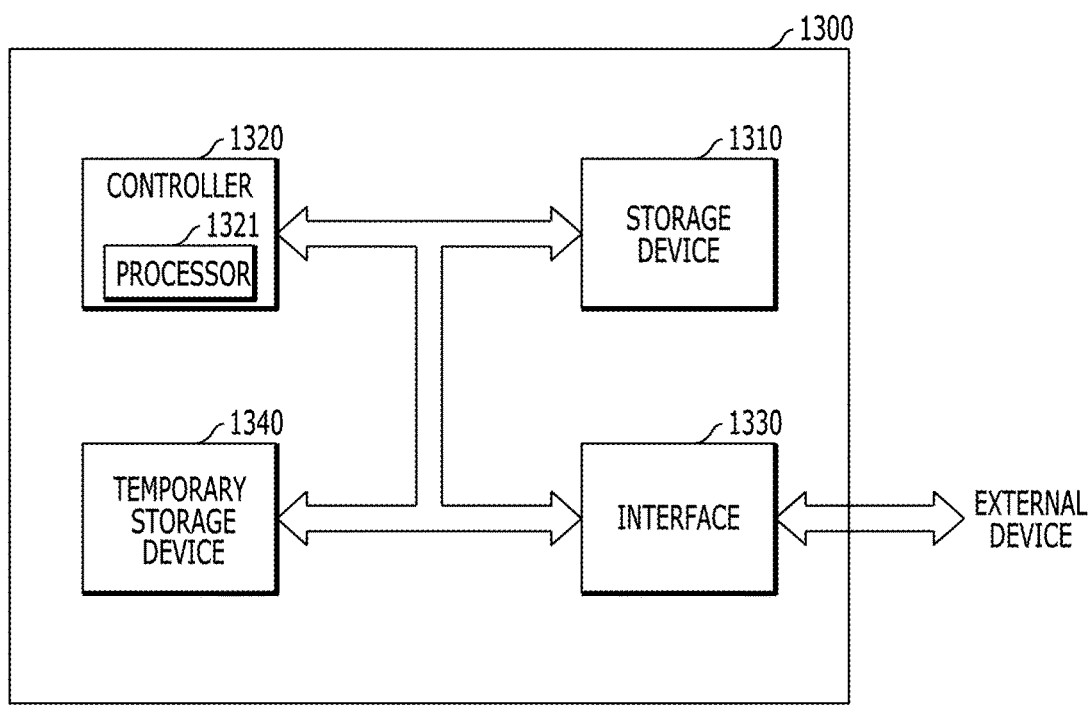
FIG. 27 is a schematic block diagram illustrating a data storage system including one or more semiconductor memory devices in accordance with embodiments of the present disclosure.

FIG. 27 is a schematic block diagram illustrating a data storage system including one or more of semiconductor memory devices 100A-100G in accordance with the embodiments of the present disclosure. Referring to FIG. 27, a data storage system 1300 may include a storage device 1310 that has a nonvolatile characteristic as a component for storing data, a controller 1320 that controls the storage device 1310, an interface 1330 for connection with an external device, and a temporary storage device 1340 for storing data temporarily.

The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory, which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control an exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is configured to perform exchange of commands and data between the data storage system 1300 and the external device. In the case where the data storage system 1300 is a card type, the interface 1330 may be compatible with interfaces that are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on; or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other. The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include at least one of the semiconductor devices 100A-100G in accordance with the embodiment of the present disclosure. Through this, operating characteristics of the storage device 1310 or the temporary storage device 1340 may be improved. Consequently, operating characteristics of the data storage system 1300 may be improved.

Figure 28:
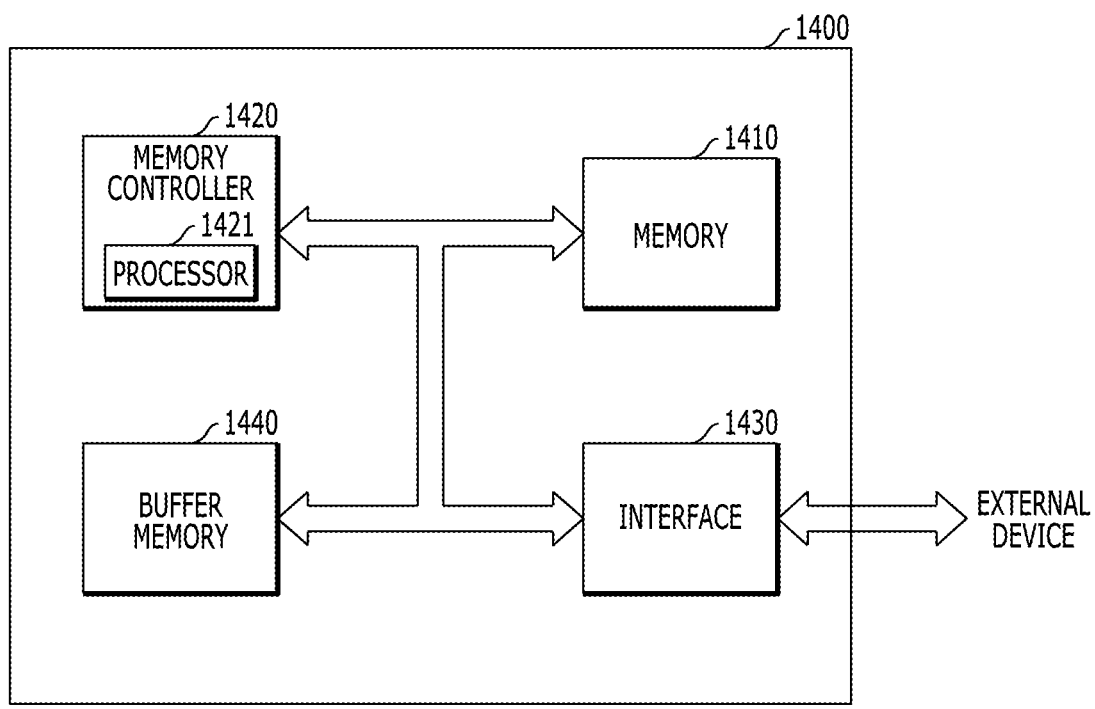
FIG. 28 is a schematic block diagram illustrating a memory system including one or more semiconductor memory devices in accordance with embodiments of the present disclosure.

FIG. 28 is a schematic block diagram illustrating a memory system 1400 that includes one or more of semiconductor memory devices 100A-100G in accordance with the embodiments of the present disclosure. Referring to FIG. 28, a memory system 1400 may include a memory 1410 that has a nonvolatile characteristic as a component for storing data, a memory controller 1420 that controls the memory 1410, an interface 1430 for connection with an external device, and so on. The memory system 1400 may be a card type, such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. The memory 1410 for storing data may include at least one of the semiconductor memory devices 100A-10OG in accordance with the embodiments of the present disclosure. Through this, operating characteristics of the memory 1410 may be improved. As a consequence, operating characteristics of the memory system 1400 may be improved.

In addition, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400. The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on; or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include at least one of the semiconductor memory devices 100A-100D in accordance with the embodiment of the present disclosure. Through this, operating characteristics of the buffer memory 1440 may be improved. As a consequence, operating characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor memory devices 100A-100G in accordance with the embodiments of the present disclosure, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 24-28 based on the semiconductor memory devices 100A-100G disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any disclosure or of what may be claimed, but rather as descriptions of features that may be specific to particular embodiments of the present disclosure. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the io claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few embodiments and examples are described. Other implementations, enhancements and variations can be made based on what is described and illustrated in this patent document.

According to the embodiments of the present disclosure, a semiconductor memory device includes a memory cell stack having a confined or buried structured selection element pattern in a hole. Thus, the total height of the memory cell stack can be reduced and the manufacturing process for the semiconductor memory device can be facilitated.

According to the embodiments of the present disclosure, since a selection element pattern of a memory cell stack has a buried structure that is confined to a hole, it can be prevented from being attacked by an etching gas during a process by which the memory cell stack is formed. Therefore, the selection element pattern of the memory cell stack can have excellent performance characteristics.

While the present disclosure has been described with respect to the specific embodiments, it will be apparent to those skilled in the art that various changes and modifications may be made without departing from the spirit and scope of the following claims.

What is claimed is:

1. An electronic device including a semiconductor memory device, the semiconductor memory device comprising:
   a lower interlayer insulating layer having a hole;
   an upper interlayer insulating layer disposed on the lower interlayer insulating layer; and
   a memory cell stack including a lower element and an upper element, the lower element being confined to the hole of the lower interlayer insulating layer, the upper element being surrounded by the upper interlayer insulating layer,
   wherein the lower element includes a lower electrode and a selection element pattern disposed on the lower electrode,
   wherein the upper element includes a memory pattern disposed on the selection element pattern and an upper electrode disposed on the memory pattern.

2. The electronic device of claim 1, wherein the semiconductor memory device further comprises:
   an upper spacer disposed on an outer surface of the upper element; and
   a lower spacer disposed on an inner surface of the hole,
   wherein the lower element is confined by the lower spacer.

3. The electronic device of claim 2,
   wherein an outer surface of an upper portion of the lower spacer is in contact with an inner surface of a lower portion of the upper spacer.

4. The electronic device of claim 2,
   wherein a cross-section of the lower spacer has a disk shape, and a cross-section of the upper spacer has a disk shape with a polygonal perimeter.

5. The electronic device of claim 1,
   wherein a cross-section of the hole has a circle shape, and a cross-section of the upper element has a rectangle shape with rounded corners.

6. The electronic device of claim 1,
   wherein the memory cell stack further includes an intermediate electrode disposed between the selection element pattern and the memory pattern, and
   wherein a lower portion of the intermediate electrode protrudes down into the hole.

7. The electronic device of claim 6,
   wherein the upper element further comprises an upper portion of the intermediate electrode, and
   wherein the upper portion of the intermediate electrode has a flat top surface.

8. The electronic device of claim 1,
   wherein the upper element further comprises a reservoir pattern disposed between the memory pattern and the upper electrode, and wherein the reservoir pattern comprises a metal, a metal compound, or both.

9. The electronic device of claim 1,
wherein the lower element further comprises a self-compliance unit pattern disposed between the lower electrode and the selection element pattern, and
wherein the self-compliance unit pattern comprises a metal oxide.

10. The electronic device of claim 9,
wherein the lower element further comprises a buffer electrode pattern between the self-compliance unit pattern and the selection element pattern, and
wherein the buffer electrode pattern comprises one or more of a metal, a metal compound, a metal silicide, and a metal alloy.

11. The electronic device of claim 10,
wherein the self-compliance unit pattern and the buffer electrode pattern each have a bowl shape, each of the self-compliance unit pattern and the buffer electrode pattern having a concave upper surface.

12. The electronic device of claim 1,
wherein the selection element pattern has a bowl shape, the selection element pattern having a concave upper surface.

13. The electronic device of claim 1,
wherein a horizontal width of the upper element is greater than a horizontal width of the lower element.

14. The electronic device of claim 1, further comprising a microprocessor, the microprocessor comprising:
a control unit configured to receive a signal including a command from an external device outside of the microprocessor, and to perform extracting, decoding of the command, or controlling an input or an output of the microprocessor;
an operation unit configured to perform an operation based on a result of the control unit decoding the command; and
a memory unit configured to store data for performing the operation, data corresponding to a result of performing the operation, or an address of data for which the operation is performed,
wherein the semiconductor memory device is a part of the memory unit in the microprocessor.

15. The electronic device of claim 1, further comprising a processing system that includes:
a processor configured to decode a command received by the processor and to control an operation for information based on a result of decoding the command;
an auxiliary memory device configured to store a program for decoding the command and the information;
a main memory device configured to call and store the program and the information from the auxiliary memory device, the processor performing the operation using the program and executing the program using the information; and
an interface device configured to perform communication between an external device and at least one of the processor, the auxiliary memory device, and the main memory device,
wherein the semiconductor memory device is a part of the auxiliary memory device or the main memory device in the processing system.

16. The electronic device of claim 1, further comprising a data storage system that includes:
a storage device configured to store data and to conserve stored data regardless of power supply;
a controller configured to control input and output of data to and from the storage device according to a command inputted from an external device;
a temporary storage device configured to temporarily store data exchanged between the storage device and the external device; and
an interface configured to perform communication between the external device and at least one of the storage device, the controller, and the temporary storage device,
wherein the semiconductor memory device is a part of the storage device or the temporary storage device in the data storage system.

17. An electronic device including a semiconductor memory device, the semiconductor memory device comprising:
a lower interlayer insulating layer having a hole;
a lower spacer disposed in the hole of the lower interlayer insulating layer;
a lower pillar disposed in the hole and confined by the lower spacer;
an upper pillar disposed on the lower pillar;
an upper spacer disposed on a sidewall of the upper spacer; and
an upper interlayer insulating layer surrounding the upper spacer and being disposed on the lower interlayer insulating layer,
wherein the lower pillar includes a lower electrode and a selection element pattern disposed on the lower electrode,
wherein the upper pillar includes a memory pattern and an upper electrode disposed on the memory pattern; and
wherein a horizontal width of the upper pillar is greater than a horizontal width of the lower pillar.

18. The electronic device of claim 17,
wherein the lower pillar further includes a self-compliance unit pattern and a buffer electrode pattern that are disposed between the lower electrode and the selection element pattern, and
wherein the upper pillar further includes an intermediate electrode and a reservoir pattern, the intermediate electrode being disposed between the selection element pattern of the lower pillar and the memory pattern, the reservoir pattern being disposed between the memory pattern and the upper electrode.

19. The electronic device of claim 18,
wherein the self-compliance unit pattern, the buffer electrode pattern, and the selection element pattern each have a bowl shape and a concave upper surface.

20. The electronic device of claim 17,
wherein an outer sidewall surface of the lower spacer and an inner sidewall surface of the upper spacer are each vertical and flat,
wherein the lower spacer and the upper spacer are spaced apart from each other, and
wherein the lower interlayer insulating layer includes a protruded rim portion disposed between the lower spacer and the upper spacer.

* * * * *